(12) United States Patent
Shimizu

(10) Patent No.: US 7,153,722 B2
(45) Date of Patent: Dec. 26, 2006

(54) METHOD AND APPARATUS FOR MANUFACTURING PHOTOVOLTAIC DEVICE

(75) Inventor: Koichi Shimizu, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 309 days.

(21) Appl. No.: 10/857,898

(22) Filed: Jun. 2, 2004

(65) Prior Publication Data
US 2004/0248336 A1 Dec. 9, 2004

(30) Foreign Application Priority Data
Jun. 6, 2003 (JP) ............................ 2003-162159
Jun. 17, 2003 (JP) ............................ 2003-172013

(51) Int. Cl.
*H01L 21/00* (2006.01)
*H01L 21/76* (2006.01)
*H01L 21/4763* (2006.01)

(52) U.S. Cl. ..................... 438/98; 438/453; 438/625; 257/E21.158

(58) Field of Classification Search ................ 438/98, 438/453, 625, 720
See application file for complete search history.

(56) References Cited

U.S. PATENT DOCUMENTS

| | | | | |
|---|---|---|---|---|
| 5,942,048 A | * | 8/1999 | Fujisaki et al. | 136/256 |
| 6,162,986 A | | 12/2000 | Shiotsuka et al. | 136/244 |
| 6,180,868 B1 | | 1/2001 | Yoshino et al. | 136/244 |
| 6,184,457 B1 | | 2/2001 | Tsuzuki et al. | 136/256 |
| 6,184,458 B1 | | 2/2001 | Murakami et al. | 136/256 |
| 6,265,242 B1 | | 7/2001 | Komori et al. | 438/66 |
| 6,271,462 B1 | | 8/2001 | Tsuzuki et al. | 136/290 |
| 6,316,832 B1 | | 11/2001 | Tsuzuki et al. | 275/747 |
| 6,479,744 B1 | | 11/2002 | Tsuzuki et al. | 136/256 |
| 6,515,218 B1 | | 2/2003 | Shimizu et al. | 136/256 |
| 6,586,270 B1 | | 7/2003 | Tsuzuki et al. | 438/57 |
| 6,689,951 B1 | | 2/2004 | Shimizu et al. | 136/256 |
| 6,706,961 B1 | | 3/2004 | Shimizu et al. | 136/256 |

FOREIGN PATENT DOCUMENTS

| | | |
|---|---|---|
| JP | 7-335921 | 12/1995 |
| JP | 11-145502 | 5/1999 |
| JP | 2003-39554 | 2/2003 |

* cited by examiner

*Primary Examiner*—Michael Lebentritt
*Assistant Examiner*—Elias M. Ullah
(74) *Attorney, Agent, or Firm*—Fitzpatrick, Cella Harper & Scinto

(57) ABSTRACT

A method of manufacturing a photovoltaic device includes: a step of fixing thin metal wires which are coated with electroconductive resin, to a principal surface of a photovoltaic member; a step of heating the photovoltaic member to which the thin metal wires are fixed; and a step of pressing an elastic film against the photovoltaic member and the thin metal wires while the pressure of gas on the side opposite the photovoltaic member across the elastic film is larger than the pressure of gas on the photovoltaic member side. The thin metal wires to serve as a collector electrode provided in a photovoltaic member are prevented from bending. This makes it possible to produce, with high yield, photovoltaic devices that have no fear of being reduced in output by bent thin metal wires.

7 Claims, 20 Drawing Sheets

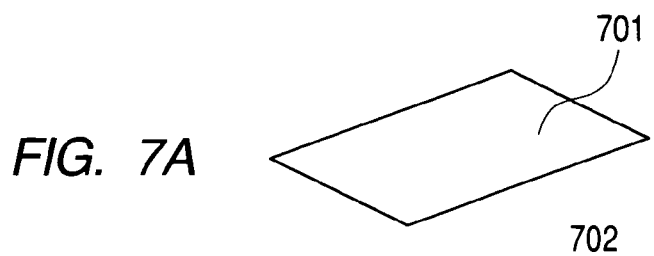
FIG. 7A
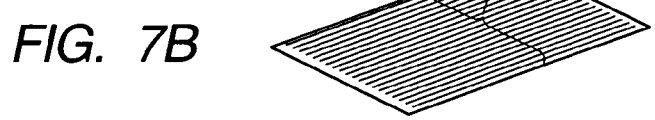
FIG. 7B
FIG. 7C
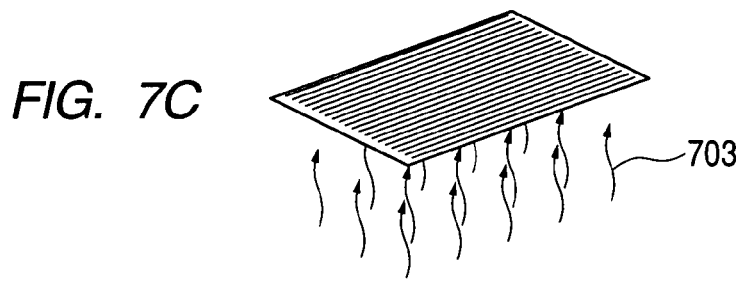
FIG. 7D
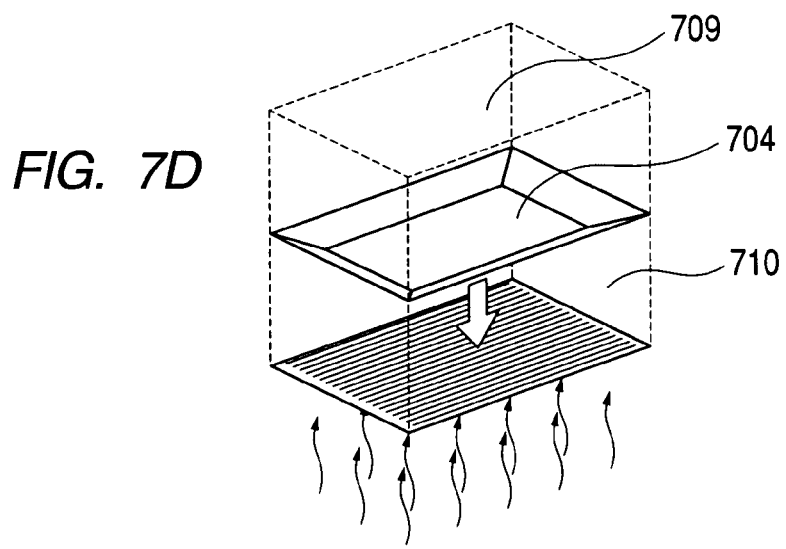
FIG. 7E
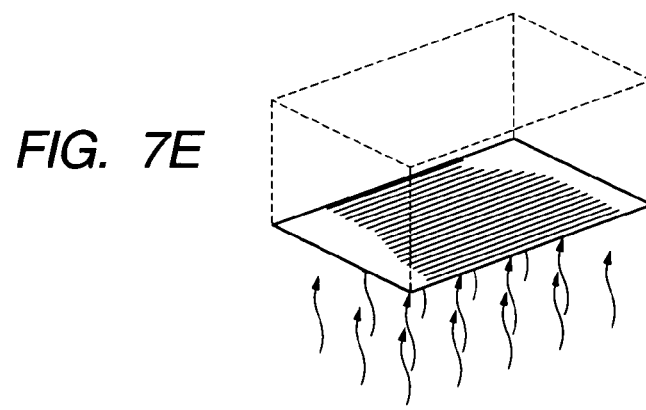

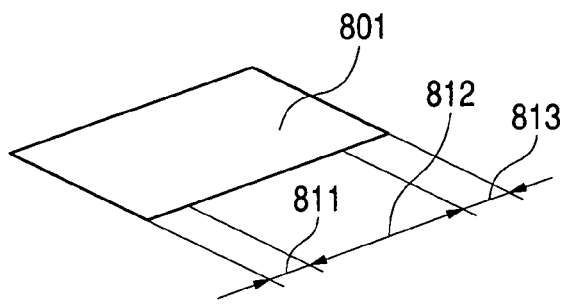
FIG. 8A
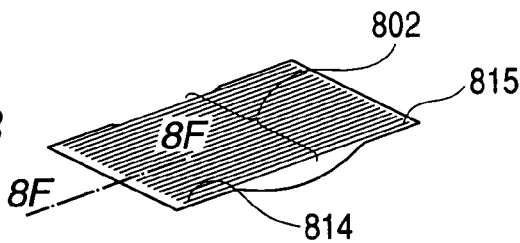
FIG. 8B
FIG. 8F
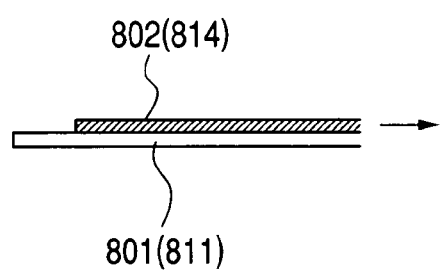
FIG. 8C
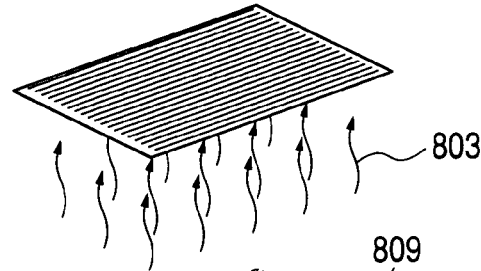
FIG. 8D
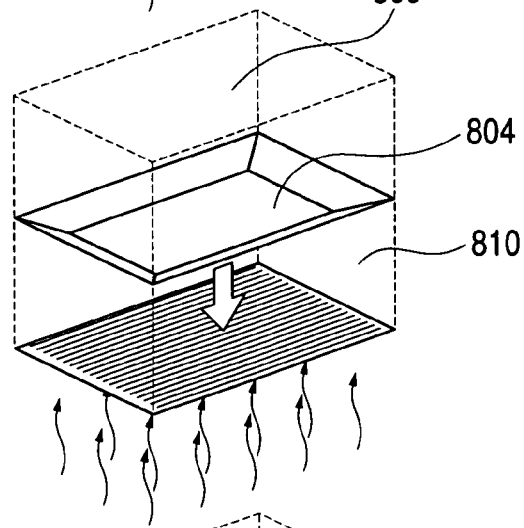
FIG. 8E
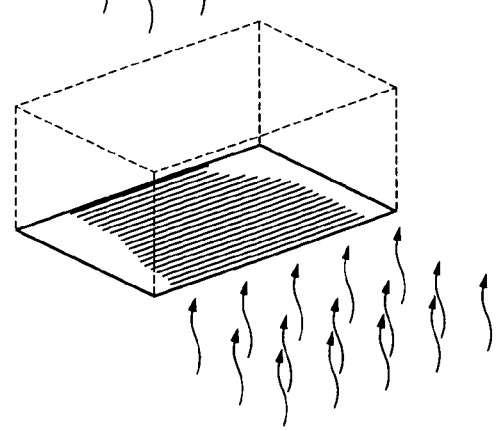

1109 1102 1106
1104 1103 1101
1105

1409 1402 1406
1404 1403 1401
1405

1427

1427

METHOD AND APPARATUS FOR MANUFACTURING PHOTOVOLTAIC DEVICE

BACKGROUND OF THE INVENTION

1. Field of the Invention

The present invention relates to a photovoltaic device manufacturing method. More specifically, the invention relates to a method and apparatus for manufacturing a photovoltaic device with a collector electrode formed from a thin metal wire on a photovoltaic member surface.

2. Related Background Art

The electrode structure of a photovoltaic device is mainly made up of a comb-like or lattice-like collector electrode, which is relatively thin and formed from metal to collect current, and a bus bar, which is a relatively thick electrode formed from metal to collect the current collected by the collector electrode. Preferable materials of the electrodes are ones that are low specific resistance, for example, silver and copper.

Methods preferred in forming these electrodes, in particular, the collector electrode, include evaporation, plating, and screen printing.

However, forming the electrodes by evaporation presents such problems as slow deposition rate, low throughput resulting from a vacuum process, and a waste of metal deposited on a mask, which is necessary to form a linear pattern.

Screen printing also has a problem in that high specific resistance of electroconductive paste used in printing, $4.0 \times 10^{-5}$ Ωcm at the lowest, makes it difficult to obtain an electrode that is low in specific resistance. Generally speaking, electroconductive paste has a specific resistance one-digit higher than that of pure silver bulk.

Furthermore, evaporation and screen printing need to make a collector electrode thicker in order to lower the resistance of the electrode without changing the area of the electrode, for example. The practical thickness of a collector electrode is 1 μm or less in evaporation and 10 μm to 20 μm in screen printing, and a collector electrode of such thickness measures 200 μm or more in width, resulting in very small aspect ratio (length-breadth ratio) and large shadow loss.

Those are contrasted by a collector electrode disclosed in Japanese Patent Application Laid-Open No. H07-335921 and Japanese Patent Application Laid-Open No. H11-145502. This collector electrode has a thin metal wire covered with resin that contains electroconductive particles. According to the publications, a thin wire of highly conductive metal such as copper is used to form the collector electrode. Therefore, the electric resistance loss remains small when the collector electrode is long and, in addition, the aspect ratio can be set to 1:1 to make shadow loss small. Moreover, the thin wire is fixed by a simple method which uses electroconductive resin.

FIGS. 6A to 6E are schematic diagrams showing a method of forming a collector electrode of a photovoltaic device which is disclosed in Japanese Patent Application Laid-Open No. H11-145502. Referring to the drawings, the related art example is described below.

(a) A piece of double-sided adhesive tape 606 is placed on each end of the principal surface of a photovoltaic member 601, which is composed of a substrate and a photovoltaic layer formed on the substrate (FIG. 6A).

(b) The entire photovoltaic member 601 is bent and, in this state, thin metal wires 602 coated with electroconductive resin are placed in lines on the photovoltaic member 601 while fixing each end of the respective thin metal wires 602 to the double sided tape 606. A bus bar electrode 607 formed from a copper film is placed on the wires 602 fixed to the tape 606 (FIG. 6B). FIG. 6F is a sectional view taken along the line 6F—6F in FIG. 6B.

(c) The photovoltaic member 603 is put on a heat plate 603, which is kept heated (FIG. 6C).

(d) The photovoltaic member 601 and the heat plate 603 are covered with a chamber 605 whose bottom face is constituted of an elastic film 604. At this point, the air in the chamber 605 is exhausted by exhaust means (not shown) from an exhaust vent (not shown) in order to prevent the elastic film 604 from being stretched downward by its own weight and brought into contact with the thin metal wires 602, which are strained like a bowstring, thereby sagging or breaking the thin metal wires 602. The exhaust means creates a difference in pressure between the air below the elastic film 604 and the air above the elastic film 604 (inside an upper portion of the chamber) to pull the elastic film 604 upward (FIG. 6D).

(e) The air below the elastic film 604 is exhausted from outlets 608 opened in the heat plate 603 while air is let in the chamber 605 to bond the thin metal wires 602 by thermocompression to the surface of the photovoltaic member 601.

According to the methods of Japanese Patent Application Laid-Open No. H07-335921 and Japanese Patent Application Laid-Open No. H11-145502, the photovoltaic member 601 and the thin metal wires 602 are heated by pressing the photovoltaic member 601 against the heat plate 608, which is heated and kept at a given temperature. Heating of the photovoltaic member 601 is stopped by moving the photovoltaic member 601 away from the heat plate 608. The photovoltaic member 601 thus can be heated and cooled in a short period of time and therefore the methods are suitable for mass production.

The method according to Japanese Patent Application Laid-Open No. H07-335921 has a problem in that the thin metal wires 602 are bent when bonded by thermocompression to the photovoltaic member 601. To avoid bending the thin metal wires 602, the method according to Japanese Patent Application Laid-Open No. H11-145502 applies a tensile force to the thin metal wires 602 prior to thermocompression bonding of the thin metal wires 602 to the photovoltaic member 601.

In this method, however, the thin metal wires 602 could be bent and bonded to the top face of the photovoltaic member 601 if the tensile force applied to the thin metal wires 602 is lessened before the thin metal wires 602 are bonded and fixed to the top face of the photovoltaic member 601.

If the thin metal wires 602 are bent and bonded to the top face of the photovoltaic member 601, a current collection path is lengthened and accordingly Joule loss is increased. Furthermore, if the thin metal wires 602 are bent and bonded to a light incidence face of the photovoltaic member 601, shadows of the thin metal wires 602 projected onto the light incidence face takes up a large area and reduces the amount of electricity generated by the photovoltaic device.

Therefore, the first improvement that is desired to be made on the related art is to avoid bending the thin metal wires 602 so that an increase in Joule loss and lowering of electricity generated by the photovoltaic device are prevented.

Japanese Patent Application Laid-Open No. 2003-039554 also discloses a collector electrode having a thin metal wire covered with resin that contains electroconductive particles. According to the publication, a thin wire of highly conductive metal such as copper is used to form the collector electrode. Therefore, the electric resistance loss remains small when the collector electrode is long and, in addition, the aspect ratio can be set to 1:1 to make shadow loss small. Moreover, the thin wire is fixed by a simple method which uses electroconductive resin.

FIGS. 14A and 14B, FIGS. 15A to 15C, FIGS. 16AX to 16DX, and FIGS. 16AY to 16DY are schematic diagrams showing a conventional method of forming a collector electrode that uses a thin metal wire. Referring to the drawings, the related art example is described below.

In FIGS. 14A and 14B, reference numeral 1501 denotes a photovoltaic member which generates electromotive force upon incidence of light. FIG. 14A is a plan view of the photovoltaic member 1501 and FIG. 14B is a side view of the photovoltaic member 1501. A piece of double-sided adhesive tape 1507 is placed on each end of the principal surface of the photovoltaic member 1501. Thin metal wires 1502 coated with electroconductive resin are placed in lines on the photovoltaic member 1501 while fixing each end of the respective thin metal wires 1502 to the double sided tape 1507. In fixing the ends of the thin metal wires 1502 to the double-sided tape 1507, an appropriate tensile force is applied to the thin metal wires 1502 to make the thin metal wires 1502 taut. A bus bar electrode 1508 formed from a copper film is placed on the wires 1502 fixed to the tape 1507, thereby completing a complex 1503.

In Japanese Patent Application Laid-Open No. 2003-039554, the complex 1503 is put in a thermocompression bonding device to bond the thin metal wires 1502 by thermocompression to the photovoltaic member 1501.

FIGS. 15A to 15C are diagrams showing the thermocompression bonding device of Japanese Patent Application Laid-Open No. 2003-039554. The thermocompression bonding device is composed of heat plate 1604, a chamber 1609, and an elastic sheet 1606, which is attached to the chamber 1609. FIG. 15A is a sectional view of the thermocompression bonding device taken along the line 15A—15A of FIG. 15B and viewed from above, and corresponds to a plan view of the heat plate 1604. FIG. 15B is a sectional view of the thermocompression bonding device taken along the line 15B—15B of FIG. 15A. FIG. 15C is a sectional view of the thermocompression bonding device taken along the line 15C—15C of FIG. 15A. The chamber 1609 is moved up and down and is placed on top of the heat plate 1604. The heat plate 1604 has an elastic sheet suction groove 1612. When the chamber 1609 is placed on top of the heat plate 1604, an O-ring 1619 is fit in the elastic sheet suction groove 1612 to create an airtight space between the heat plate 1604 and the elastic sheet 1606. The heat plate 1604 also has deaeration holes 1613, which are provided to remove the air from the airtight space created between the heat plate 1604 and the elastic sheet 1606. The elastic sheet suction groove 1612 and the deaeration holes 1613 are connected to a vacuum pump 1618 through pipes 1614 and 1615 and through valves 1616 and 1617, respectively. As shown in an enlarged view in FIG. 15C, holes 1610 are opened in the heat plate 1604, allowing movable support members 1605 to protrude from the principal surface of the heat plate 1604. The movable support members 1605 are kept protruded unless an external force is applied by springs 1611.

FIGS. 16AX to 16DX and FIGS. 16AY to 16DY show a process of processing the complex 1503 in the thermocompression bonding device of FIGS. 15A to 15C. The process proceeds from FIG. 16AX to FIG. 16DX and from FIG. 16AY to FIG. 16DY. FIGS. 16AX to 16DX show sectional views of the thermocompression bonding device taken along the line 15B—15B of FIG. 15A. FIGS. 16AY to 16DY show sectional views of the thermocompression bonding device taken along the line 15C—15C of FIG. 15A.

In FIGS. 16AX and 16AY, an automatic hand (not shown) puts a complex 1703 on movable support members 1705 protruding from the principal surface of a heat plate 1704. The heat plate 1704 is kept heated by means that is not shown in the drawings. At this point, the movable support members 1705 are pushed upward by the springs 1611 (see FIGS. 15A to 15C) keeping the complex 1703 above the heat plate 1704 and the temperature increase of the complex 1703 at a slow rate.

In FIGS. 16BX and 16BY, a chamber 1709 is lowered until an elastic sheet 1706 attached to the chamber 1709 comes into contact with the complex 1703.

In FIGS. 16CX and 16CY, the chamber 1709 is further lowered until an O-ring 1719 attached to the chamber 1709 fits in an elastic sheet suction groove 1712 provided in the heat plate 1704. At the same time the chamber 1709 is lowered, a valve 1716 is opened to deaerate the interiors of a pipe 1714 and the elastic sheet suction groove 1712 by a vacuum pump 1718. In this way, the elastic sheet 1706 is fit over the heat plate 1704 by sucking and the complex 1703 is held inside an airtight space 1720 surrounded by the elastic sheet 1706 and the heat plate 1704. However, the complex 1703 is still not in contact with the heat plate 1704 and the temperature of the heat plate 1703 rises at a slow rate.

In FIGS. 16DX and 16DY, a valve 1717 is also opened to deaerate the interiors of a pipe 1715, deaeration holes 1713, and the airtight space 1720 created in FIGS. 16CX and 16CY by the vacuum pump 1718. As a result, the elastic sheet 1706 is tightly fit over the complex 1703 and accordingly thin metal wires 1702 are fixed to the top face of a photovoltaic member 1701. The deaeration also causes atmospheric pressure to compress the springs that have been pushing the movable support members 1705 upward, bringing the complex 1703 into contact with the heat plate 1704. The temperature of the complex 1703 is thus increased rapidly to the temperature level of the heat plate 1704 and the bonding phenomenon taking place between the thin metal wires 1702 and the photovoltaic member 1701 is advanced.

The state shown in FIGS. 16DX and 16DY is maintained for a given period of time until the thin metal wires 1702 are thoroughly bonded to the top face of the photovoltaic member 1701. Then the chamber 1709 is lifted to stretch the springs 1611 and move the complex 1703 away from the heat plate 1704. This lowers the temperature of the complex 1703. Thermocompression bonding of the thin metal wires 1702 to the photovoltaic member 1701 is thus completed.

According to this method, the heat plate 1704 is kept heated to start heating the photovoltaic member 1701 and the thin metal wires 1702 by putting the complex 1703 on the heat plate 1704 and to stop the heating by moving the complex 1703 away from the heat plate 1704. The photovoltaic member 1701 thus can be heated and cooled in a short period of time and therefore the method is suitable for mass production. This method is also superior for the ease with which an automatic hand, for example, one with claws, puts the photovoltaic member 1701 on the heat plate 1704 and moves the photovoltaic member 1701 away from the heat plate 1704 since the movable support members 1705 keep the complex 1703 above the heat plate 1704 on these occasions.

However, the conventional method described above is not always successful in bonding the thin metal wires 1702 by thermocompression to the photovoltaic member 1701 and sometimes the thin metal wires 1702 are bonded in a bent state to the top face of the photovoltaic member 1701 or are only partially bonded.

In the conventional method, at the stage shown in FIGS. 16CX and 16CY, the thin metal wires 1702 are not fixed yet except the ends fixed to the photovoltaic member 1701. Although the thin metal wires 1702 are taut owing to a tensile force applied in advance, the elasticity of the thin metal wires 1702 allows the wires to quiver like a string. When the airtight space 1720 is deaerated over a period from FIGS. 16CX and 16CY to FIGS. 16DX and 16DY, a change in gas pressure or a gas flow in the airtight space 1720 causes the thin metal wires 1702 to quiver. The elastic sheet 1706 presses the thin metal wires 1702 that are still quivering against the top face of the photovoltaic member 1701. Accordingly, the thin metal wires 1702 are sometimes fixed in a bent state to the top face of the photovoltaic member 1701.

If the elastic sheet 1706 is sagged when fit tightly over the complex 1703 and the heat plate 1704 by deaerating the airtight space 1720 over a period from FIGS. 16CX and 16CY to FIGS. 16DX and 16DY, a wrinkle 1721 may appear in the elastic sheet 1706 as shown in an enlarged view in FIG. 16DX. In this case, the force by which the thin metal wires 1702 are pressed against the photovoltaic member 1701 is weaker under the wrinkle 1721 and therefore the thin metal wires 1702 are insufficiently bonded to the photovoltaic member 1701 in this portion.

As a counter measure to this problem, the inventor of the present invention have thought of a method shown in FIGS. 17A to 17D. The method is capable of preventing the thin metal wires 1702 from quivering upon deaeration of the airtight space 1720 between the elastic sheet 1706 and the heat plate 1704 and accordingly preventing the elastic sheet from sagging. FIGS. 17A to 17D are sectional views corresponding to FIGS. 16AY to 16DY. FIG. 17A shows a state after completion of a first step in which a complex 1803 with thin metal wires 1802 fixed at each end onto a photovoltaic member 1801 is put on movable support members 1805 protruding from the principal surface of a heat plate 1804. FIGS. 17B to 17D show in stages how an elastic sheet 1806 is continuously pressed against the complex 1803. Throughout the stages shown in FIGS. 17B to 17D, the pressure applied to a surface of the elastic sheet 1806 that faces the heat plate 1804, namely, the top face of the elastic sheet in the drawings, is kept larger by means (not shown) than the pressure applied to a surface of the elastic sheet 1806 that is opposite to the heat plate 1804, namely, the bottom face of the elastic sheet in the drawings. The elastic sheet therefore bulges downward as shown in FIGS. 17A to 17D. At the stage shown in FIG. 17B, the elastic sheet stretched downward comes into contact with the central portion (an area A in the drawing) of the thin metal wires 1802 to apply a pressure to the area A. Therefore, the central portion of the thin metal wires 1802 is the first to be fixed to the photovoltaic member 1801. The thin metal wires 1802 are thus ironed out and fixed in a continuous manner from the central portion (area A in FIG. 17B) toward the ends over FIGS. 17B to 17D. At this point, the air between the elastic sheet 1806 and the heat plate 1804 is pushed rightward and leftward of FIGS. 17A to 17D.

This method does not need to deaerate the space between the elastic sheet 1806 and the heat plate 1804, and therefore the thin metal wires 1802 are prevented from quivering unlike the conventional method illustrated in FIGS. 16AX to 16DX and FIGS. 16AY to 16DY. Even if deaeration holes are provided in the heat plate 1804 as in FIGS. 16AX to 16DX and FIGS. 16AY to 16DY to deaerate the air between the elastic sheet 1806 and the heat plate 1804 after the step of FIG. 17D, the thin metal wires 1802 have already been pressed against the photovoltaic member 1801 by the elastic sheet 1806 by that point and are prevented from quivering. The method is thus capable of avoiding a situation in which the thin metal wires 1802 are fixed in a bent state onto the photovoltaic member 1801.

A tensile force is kept applied to the elastic sheet 1806 in FIGS. 17A to 17D since the pressure applied to the top face of the elastic sheet 1806 is always larger than the pressure applied to the bottom face. Under the constant application of tensile force, the elastic sheet 1806 is pressed against the complex 1803 and the heat plate 1804 continuously and radially from the central portion (area A in FIG. 17B). The elastic sheet 1806 is thus prevented from sagging and forming wrinkles unlike the related art, and accordingly the thin metal wires 1802 can be bonded to the photovoltaic member 1801 satisfactorily.

However, the method illustrated in FIGS. 17A to 17D has been found to allow thin metal wires to bond in a bent state in the case where a photovoltaic member has a thin substrate of insufficient rigidity from the following reason:

Since the complex 1803 is depressed by the elastic sheet 1806 bulging downward, the central portion of the complex 1803 is deformed to have a concave shape and to sink the movable support members 1805 in the central portion of the heat plate 1804 first. The concave deformation of the central portion eases the tensile force applied to the thin metal wires 1802, which are fixed to the surface of the complex 1803. With their tautness eased, the thin metal wires 1802 could be fixed in a bent state onto the photovoltaic member 1801 by the elastic sheet 1806.

If the thin metal wires 1702 are bonded in a bent state to the top face of the photovoltaic member 1701, Joule loss increases as the current collection path is lengthened. Furthermore, if the thin metal wires 1702 are bent and bonded to a light incidence face of the photovoltaic member 1701, shadows of the thin metal wires 1702 projected onto the light incidence face take up a large area and reduce the amount of electricity generated by the photovoltaic device.

In addition, when the thin metal wires 1702 are only partially bonded to the photovoltaic member 1701, the electric resistance is raised in a portion where the bonding is insufficient causing the photovoltaic device to generate electricity in a reduced amount.

Therefore, the second improvement that is desired to be made on the related art is to avoid bending of the thin metal wires 1702 and local bonding failure so that an increase in Joule loss and lowering of electricity generated by the photovoltaic device are prevented.

SUMMARY OF THE INVENTION

According to a first aspect of the present invention, there is provided a method of manufacturing a photovoltaic device, including:

a first step of fixing thin metal wires which are coated with electroconductive resin, to a principal surface of a photovoltaic member;

a second step of heating the photovoltaic member to which the thin metal wires are fixed; and a third step of pressing an elastic film against the photovoltaic member and the thin metal wires while a pressure of first gas on a side opposite the photovoltaic member across the elastic film is larger than a pressure of second gas present in a space between the elastic film and the principal surface of the photovoltaic member.

In further aspect of the method, the first step is composed of:

a first sub-step of elastically deforming an intermediate region of the photovoltaic member to make the intermediate region convex in a direction opposite to a normal line direction of the principal surface of the photovoltaic member while maintaining shapes of a first region and a second region of the photovoltaic member, the intermediate region being located between the first region and the second region;

a second sub-step of fixing a first portion of the thin metal wires to the first region and fixing a second portion of the thin metal wires to the second region; and a third sub-step of undoing the elastic deformation to apply a tensile force to an intermediate portion between the first portion and the second portion of the thin metal wires.

In further aspect of the method, a step of shaping the photovoltaic member along an outer wall of a column is put before the first step, and the thin metal wires are fixed in the first step to make a longitudinal direction of the thin metal wires parallel to an axis of the column.

As a means to attain the above object, an apparatus for manufacturing a photovoltaic device according to the present invention includes:

a first means for fixing thin metal wires which are coated with electroconductive resin, to a principal surface of a photovoltaic member;

a second means for heating the photovoltaic member to which the thin metal wires are fixed; and a third means for pressing an elastic film against the photovoltaic member and the thin metal wires while a pressure of first gas on a side opposite the photovoltaic member across the elastic film is larger than a pressure of second gas present in a space between the elastic film and the principal surface of the photovoltaic member.

Further, in further aspect of the apparatus, the first means is composed of:

a first sub-means for elastically deforming an intermediate region of the photovoltaic member to make the intermediate region convex in a direction opposite to a normal line direction of the principal surface of the photovoltaic member while maintaining shapes of a first region and a second region of the photovoltaic member, the intermediate region being located between the first region and the second region;

a second sub-means for fixing a first portion of the thin metal wires to the first region and fixing a second portion of the thin metal wires to the second region; and a third sub-means for undoing the elastic deformation to apply a tensile force to an intermediate portion between the first portion and the second portion of the thin metal wires.

Further, in further aspect of the apparatus, the apparatus for manufacturing a photovoltaic device further includes means for shaping the photovoltaic member along an outer wall of a column, in which the first means is means for fixing the thin metal wires in a manner that makes a longitudinal direction of the thin metal wires parallel to an axis of the column.

According to the first aspect of the present invention, thin metal wires are prevented from bending in a method of forming a collector electrode with thin metal wires coated with conductive resin and bonded by thermocompression to the principal surface of a photovoltaic member. This makes it possible to produce, with high yield, photovoltaic devices that have no fear of being reduced in output by bent thin metal wires.

According to a second aspect of the present invention, there is provided a method of manufacturing a photovoltaic device, including:

a first step of placing a complex which is obtained by fixing thin metal wires at both ends onto a photovoltaic member, on movable support members protruding from a principal surface of a heat plate; and a second step of pressing an elastic sheet against the complex while a pressure applied to a surface of the elastic sheet that is opposite the heat plate is larger than a pressure applied to a surface of the elastic sheet that faces the heat plate, in which the movable support members sink in the heat plate before the elastic sheet comes into contact with the complex.

Further, there is provided a method of manufacturing a photovoltaic device, including:

a first step of placing a complex which is obtained by fixing thin metal wires at both ends onto a photovoltaic member, on movable support members protruding from a principal surface of a heat plate; and a second step of pressing an elastic sheet against the complex while a pressure applied to a surface of the elastic sheet that is opposite the heat plate is larger than a pressure applied to a surface of the elastic sheet that faces the heat plate, in which the movable support members simultaneously sink in the heat plate in conjunction with one another.

Further, there is provided a method of manufacturing a photovoltaic device, including:

a first step of placing a complex which is obtained by fixing thin metal wires at both ends onto a photovoltaic member, on movable support members protruding from a principal surface of a heat plate; and a second step of pressing an elastic sheet against the complex while a pressure applied to a surface of the elastic sheet that is opposite the heat plate is larger than a pressure applied to a surface of the elastic sheet that faces the heat plate, in which the complex is held in a manner that places edges of the complex on a lower plane than a central portion of the complex before the elastic sheet is pressed against the complex.

Further, in further aspect of the method, the movable support members have different levels of supporting power.

Moreover, as a means to attain the above object, an apparatus for manufacturing a photovoltaic device according to the present invention includes:

a first means for placing a complex which is obtained by fixing thin metal wires at both ends onto a photovoltaic member, on movable support members protruding from a principal surface of a heat plate; and a second means for pressing an elastic sheet against the complex while a pressure applied to a surface of the elastic sheet that is opposite the heat plate is larger than a pressure applied to a surface of the elastic sheet that faces the heat plate, in which the movable support members sink in the heat plate before the elastic sheet comes into contact with the complex.

Further, there is provided an apparatus for manufacturing a photovoltaic device, including:

a first means for placing a complex which is obtained by fixing thin metal wires at both ends onto a photovoltaic member, on movable support members protruding from a principal surface of a heat plate; and a second means for pressing an elastic sheet against the complex while a pressure applied to a surface of the elastic sheet that is opposite the heat plate is larger than a pressure applied to a surface of the elastic sheet that faces the heat plate, in which the movable support members simultaneously sink in the heat plate in conjunction with one another.

Further, there is provided an apparatus for manufacturing a photovoltaic device, including:

a first means for placing a complex which is obtained by fixing thin metal wires at both ends onto a photovoltaic member, on movable support members protruding from a principal surface of a heat plate; and a second means for pressing an elastic sheet against the complex while a pressure applied to a surface of the elastic sheet that is opposite the heat plate is larger than a pressure applied to a surface of the elastic sheet that faces the heat plate, in which the complex is held in a manner that places edges of the complex on a lower plane than a central portion of the complex before the elastic sheet is pressed against the complex.

Further, in further aspect of the apparatus, the movable support members have different levels of supporting power.

According to the second aspect of the present invention, thin metal wires are prevented from bending in a method of forming a collector electrode with thin metal wires coated with conductive resin and bonded by thermocompression to the principal surface of a photovoltaic member. This makes it possible to produce, with high yield, photovoltaic devices that have no fear of being reduced in output by bent thin metal wires.

Other features and advantages of the present invention will be apparent from the following description taken in conjunction with the accompanying drawings.

BRIEF DESCRIPTION OF THE DRAWINGS

FIGS. 7A, 7B, 7C, 7D and 7E are diagrams illustrating an embodiment of the first aspect of the present invention;

FIGS. 8A, 8B, 8C, 8D, 8E and 8F are diagrams illustrating another embodiment of the first aspect of the present invention;

DESCRIPTION OF THE PREFERRED EMBODIMENTS

Figure 1A:
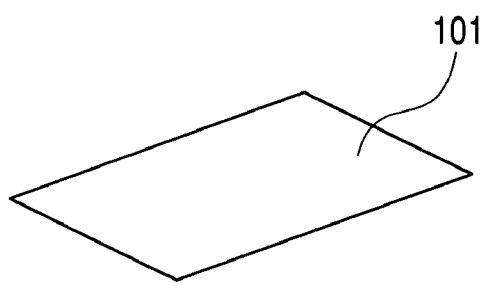
FIGS. 1A, 1B, 1C and 1D are diagrams illustrating an example of a first aspect of the present invention.

Embodiments of a first aspect of the present invention will be described below.

FIGS. 7A to 7E are diagrams illustrating an embodiment of the present invention. The drawings schematically show the present invention. A photovoltaic device manufacturing method of the present invention includes: a first step of fixing thin metal wires 702, which are coated with electroconductive resin (not shown), to the principal surface of a photovoltaic member 701 (FIGS. 7A and 7B); a second step of heating the photovoltaic member 701 to which the thin metal wires 702 are fixed (FIG. 7C, heat is denoted by 703); and a third step of pressing an elastic film 704 against the photovoltaic member 701 while the pressure of first gas 709 on the side opposite the photovoltaic member 701 across the elastic film 704 is larger than the pressure of second gas 710 in the space between the elastic film 704 and the principal surface of the photovoltaic member 701 (FIGS. 7D and 7E).

It is necessary to heat the thin metal wires 702 and the photovoltaic member 701 and to apply a pressure by which the thin metal wires 702 are pressed against the photovoltaic member 701 in order to bond the thin metal wires 702 by thermocompression to the photovoltaic member 701. The thin metal wires 702 should not be bonded by thermocompression in a bent state to the photovoltaic member 701, and the best way to avoid this is to heat the thin metal wires 702 and the photovoltaic member 701 after the thin metal wires 702 are pressed against the photovoltaic member 701. However, taking mass-producibility into account, a practically desirable method is to prevent the thin metal wires 702 from bending by pressurizing while heating as shown in FIGS. 7A to 7E. This is because heat is easily diffused in all directions whereas it is difficult to lower the temperature in an instant and, in many cases, pressurizing means itself reaches high temperature through repetition of thermocompression bonding process with the result that heating precedes pressurizing. The pressurizing means here is, for example, the elastic film 704 and a member for supporting the photovoltaic member 701 when pressing the elastic film 704 against the photovoltaic member 701 (the member is a heat plate 603 in FIG. 6C, but is not shown in FIGS. 7A to 7E). Waiting for the pressurizing means which has been heated to high temperature to completely cool down before starting the next round of thermocompression bonding process is not desirably since it takes time and lowers mass-producibility.

A conventional way to prevent lowering of mass-producibility is shown in FIGS. 6A to 6E. An elastic film 604 is pressed against a photovoltaic member 601 while heating the photovoltaic member 601 by putting the photovoltaic member 601 on the heat plate 603, which is kept heated, and while setting the pressure of first gas on the side opposite the photovoltaic member 601 across the elastic film 604 larger than the pressure of second gas present in a space between the elastic film 604 and the principal surface of the photovoltaic member 601.

Figure 6A:
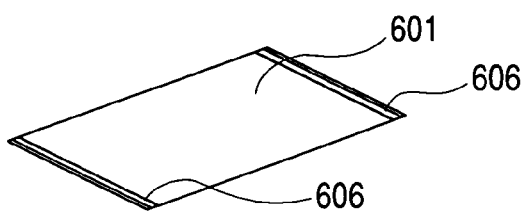
FIGS. 6A, 6B, 6C, 6D, 6E and 6F are diagrams illustrating a related art.
Figure 6B:
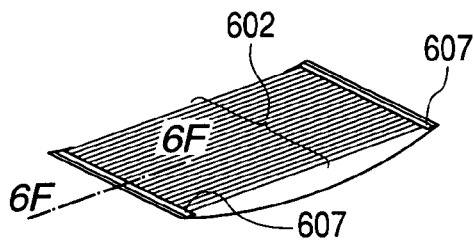
Figure 6F:
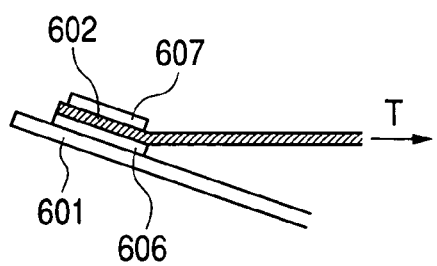
Figure 6C:
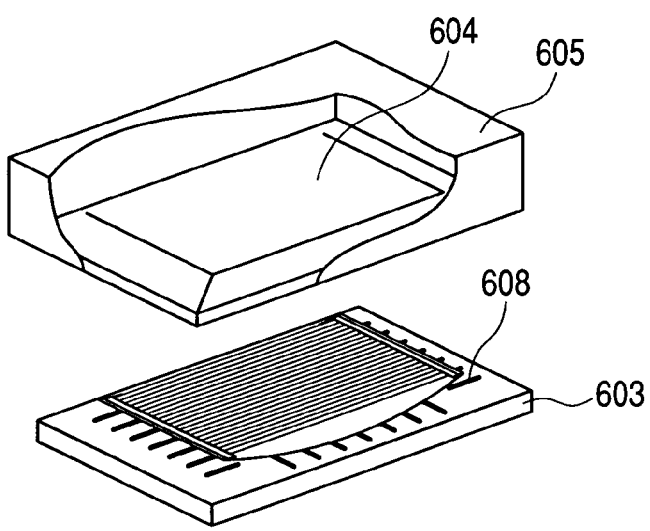
Figure 6D:
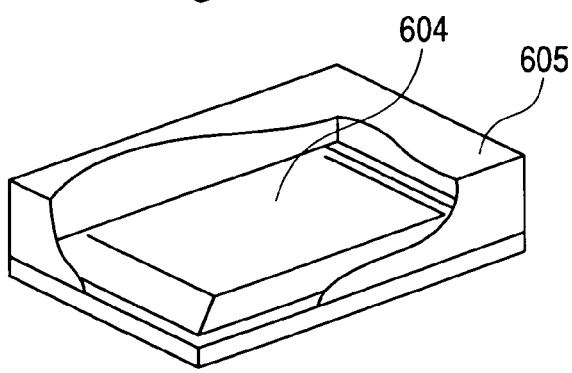
Figure 6E:
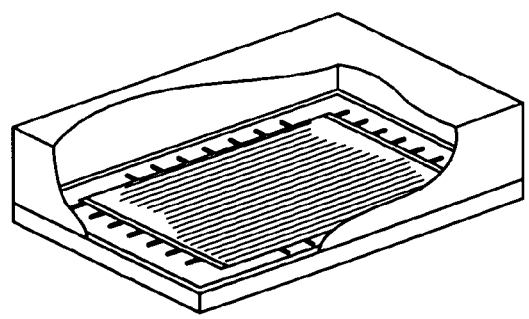
Figure 9A:
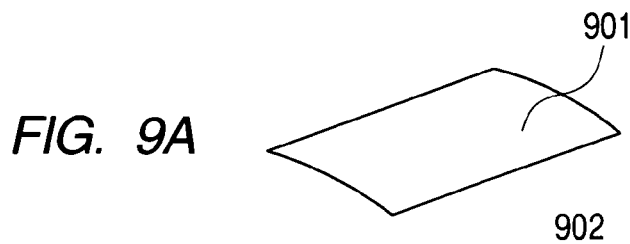
FIGS. 9A, 9B, 9C, 9D and 9E are diagrams illustrating still another embodiment of the first aspect of the present invention.
Figure 9B:
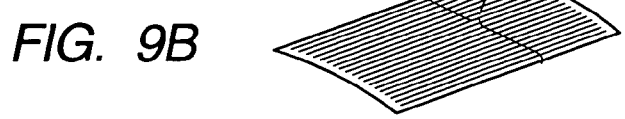
Figure 9C:
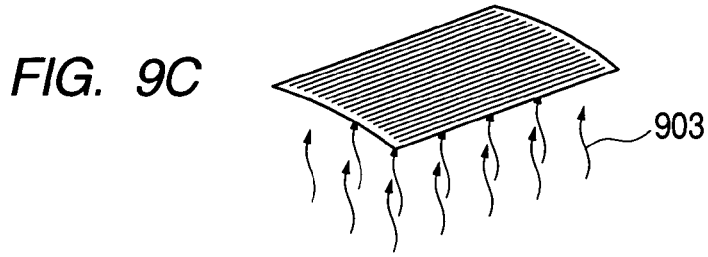
Figure 9D:
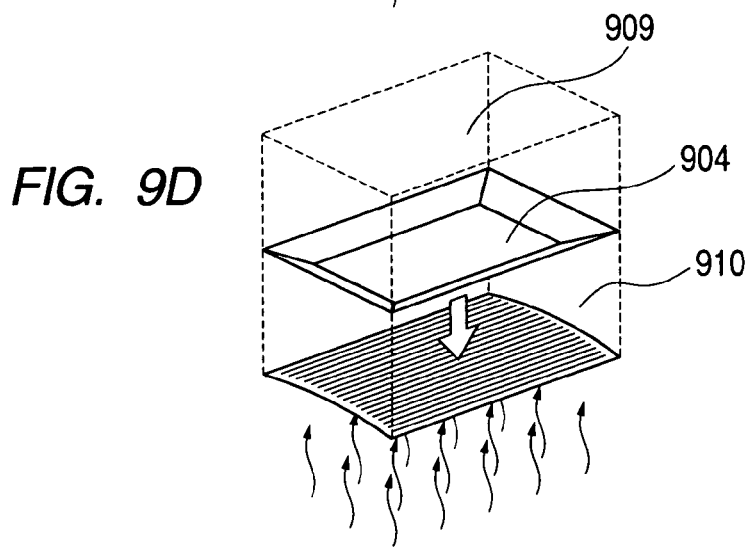
Figure 9E:
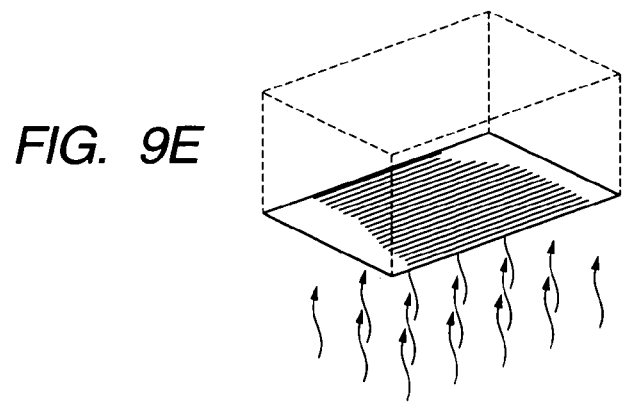

In the conventional method, however, there is a time lapse between the start of heating of the photovoltaic member 601 (FIG. 6C) and the start of application of a pressure by which thin metal wires 602 are pressed against the photovoltaic member 601 (FIG. 6E). The thin metal wires 602 are readily loosened in portions that are fixed to the principal surface of the photovoltaic member 601, or bowed and twisted during this time lapse, thereby increasing the risk of thermocompression bonding of the thin metal wires 602 in a bent state to the principal surface of the photovoltaic member 601.

This results from a rise in temperature of the photovoltaic member 601 and the thin metal wires 602 before the thin metal wires 602 are pressed against the principal surface of the photovoltaic member 601 by the elastic film 604. As the temperature is raised, the thin metal wires 602 are bowed and twisted due to a difference in thermal expansion coefficient between the thin metal wires 602 and the electroconductive resin coating the thin metal wires 602, an uneven thickness of the electroconductive resin coat, and other reasons. The bowing and twisting of the thin metal wires 602 are also likely to be caused by easing of the tensile force applied to the thin metal wires 602 which results from softening of pieces of adhesive tape 606, which is provided to fix the thin metal wires 602 onto the photovoltaic member 601, stretching of the thin metal wires 602 themselves due to thermal expansion, and from other reasons.

The temperature of the photovoltaic member 601 and the thin metal wires 602 is particularly rapidly increased during a period from laying the elastic film 604 over the principal surface of the photovoltaic member 601 while pulling the elastic film 604 upward and keeping the pressure of the first gas on the side opposite the photovoltaic member 601 across the elastic film 604 smaller than the pressure of the second gas present in a space between the elastic film 604 and the principal surface of the photovoltaic member 601 (FIG. 6D), to fitting the elastic film 604 tightly over the principal surface of the photovoltaic member 601 by exhausting the second gas and raising the pressure of the first gas (FIG. 6E). Therefore, the risk of bowing and twisting the thin metal wires 602 is highest during this period.

The present invention solves this problem by laying the elastic film 704 over the principal surface of the photovoltaic member 701 while pushing the elastic film 704 downward with the pressure of the first gas on the side opposite the photovoltaic member 701 across the elastic film 704 kept larger than the pressure of the second gas present in a space between the elastic film 704 and the principal surface of the photovoltaic member 701. Compared to the conventional method in which the elastic film 604 is laid over the principal surface of the photovoltaic member 601 while pulling the elastic film 604 upward and keeping the pressure of the first gas on the side opposite the photovoltaic member 601 across the elastic film 604 smaller than the pressure of the second gas present in a space between the elastic film 604 and the principal surface of the photovoltaic member 601 (FIG. 6D) and then the elastic film 604 is tightly fit over the principal surface of the photovoltaic member 601 by exhausting the second gas and raising the pressure of the first gas (FIG. 6E), the present invention does not have the time lapse between heating and fitting the elastic film 604 tightly over the principal surface of the photovoltaic member 601. That is, the present invention is free from the situation of the conventional technique in which the temperature is rapidly raised while the thin metal wires 602 are not restrained by being pressed against the photovoltaic member 601 by the elastic film 604.

In other words, in the present invention, the temperature is rapidly raised while the thin metal wires 702 are pressed against the photovoltaic member 701 by the elastic film 704. In this way, forces which are generated by various causes accompanying a rapid increase in temperature of the thin metal wires 702 and which could bow and twist the thin metal wires 702 can be contained by the elastic film 704 and, as a result, the risk of thermocompression bonding of the thin metal wires 702 in a bent state to the principal surface of the photovoltaic member 701 is lowered considerably.

If the thin metal wires 702 are prevented from being bonded in a bent state to the light incidence face of the photovoltaic member 701, it is possible to avoid a reduction in amount of electricity generated by the photovoltaic device which is due to an increased area of shadows of the thin metal wires 702 projected onto the light incidence face, and an increase in Joule loss which is due to a lengthened current collection path.

FIGS. 8A to 8E are diagrams illustrating another embodiment of the present invention. The drawings schematically show the present invention. This embodiment differs from the embodiment shown in FIGS. 7A to 7E in that a first step of fixing thin metal wires 802, which are coated with electroconductive resin, to the principal surface of a photovoltaic member 801 is composed of: a first sub-step of elastically deforming an intermediate region 812 of the photovoltaic member 801 to make the region 812 convex in a direction opposite to the normal line direction of the principal surface of the photovoltaic member 801 while maintaining the shapes of a first region 811 and a second region 813 of the photovoltaic member 801; a second sub-step of fixing a first portion 814 of the thin metal wires 802 to the first region 811 and fixing a second portion 815 of the thin metal wires 802 to the second region 813; and a third sub-step of undoing the elastic deformation of the intermediate region 812 to thereby apply a tensile force to an intermediate portion between the first portion 814 and the second portion 815 of the thin metal wires 802.

Conventionally, thermocompression bonding of the thin metal wires 802 in a bent state is avoided by applying a tensile force to the thin metal wires 802 when fixing the thin metal wires 802 to the principal surface of the photovoltaic member 801. According to the conventional method shown in FIGS. 6A to 6F, the entire photovoltaic member 601 is bent before the ends of the respective thin metal wires 602 are fixed to the ends of the photovoltaic member 601. In this method, a tensile force T applied to the thin metal wires 602 has a vector directed to pull the thin metal wires 602 away from the principal surface of the photovoltaic member 601 toward the normal line direction of the principal surface as shown in FIG. 6F, which is a sectional view taken along the line 6F—6F in FIG. 6B. It is difficult to fix the thin metal wires 602 against the force directed to pull the thin metal wires 602 away, and lessening of the tensile force in this portion could cause the thin metal wires 602 to bow and twist.

As described above, the elastic deformation of the intermediate region 812 is undone in this embodiment. Therefore, as shown in FIG. 8F, which is a sectional view taken along the line 8F—8F in FIG. 8B, a tensile force T applied to the thin metal wires 802 does not have a vector directed to pull the thin metal wires 802 away from the principal surface of the photovoltaic member 801 toward the normal line direction of the principal surface. The tensile force is thus prevented from being eased in this portion and bowing and twisting of the thin metal wires 802 can be avoided.

FIGS. 9A to 9E are diagrams illustrating still another embodiment of the present invention. The drawings schematically show the present invention. This embodiment differs from the embodiment shown in FIGS. 7A to 7E in that a photovoltaic member 901 is shaped to conform to the outer wall of a column and that thin metal wires 902 are positioned to make a direction of the thin metal wires 902 parallel to the axial direction of the column in a first step of fixing the thin metal wires 902 to the principal surface of the photovoltaic member 901.

A conventional photovoltaic member is planar as shown in FIG. 6A and is readily bent. If the photovoltaic member 601 is bent along the thin metal wires 602 after the thin metal wires 602 are fixed to the principal surface of the photovoltaic member 601, a tensile force is applied to the thin metal wires 602. If the tensile force is too strong, the bond is weakened in portions where the thin metal wires 602 are fixed to the photovoltaic member 601 and the thin metal wires 602 themselves are stretched by plastic deformation. As a result, the thin metal wires 602 are easily bowed and twisted.

In contrast, the photovoltaic member 901 is warped in a direction perpendicular to the thin metal wires 902 in the method of this embodiment, making it difficult for the photovoltaic member 901 to bend in a direction parallel to the thin metal wires 902. The thin metal wires 902 therefore are bowed and twisted less than in the related art.

The terms used in the above will be described below.

(Electroconductive Resin)

Electroconductive resin is obtained by dispersing electroconductive filler in binder resin. Examples of the filler include powder of silver, copper, or like other metals, powder of ITO, ZnO, $SnO_2$, $In_2O_3$, $TiO_2$, or like other oxides, carbon powder, and graphite powder. The binder resin is preferably resin that is easy to form a coat for a thin metal wire, is easy to handle, has flexibility, and is highly weatherproof. Specifically, a preferable binder resin material is thermosetting resin such as urethane resin, epoxy resin, phenol resin, polyvinyl formal resin, and alkyd resin, or resin obtained by altering these listed above. In particular, urethane resin, epoxy resin and phenol resin are used as an insulative coating material for enamel wires and are superior in flexibility and producibility. Furthermore, their moisture resistance and adhesion make them preferable as a collector electrode material for a photovoltaic device. It is also possible to employ thermoplastic resin such as butyral resin, phenoxy resin, polyamide resin, polyamide imide resin, melamine resin, acrylic resin, styrene resin, polyester resin, and fluorocarbon resin. Of these selections of thermoplastic resin, butyral resin, phenoxy resin, polyamide resin, and polyamide imide resin are materials superior in flexibility, moisture resistance, and adhesion, which makes them preferable as a collector electrode material for a photovoltaic device. The effects of the present invention can be obtained irrespective of the type of electroconductive resin used.

(Thin Metal Wire)

A wire material supplied industrially and stably is preferred for the thin metal wire, and it is desirable to choose metal having a specific resistance of $10^{-4}$ Ωcm or less as a metal member for forming the thin metal wire. For example, copper, silver, gold, platinum, aluminum, molybdenum, and tungsten are preferred because of their small specific resistance. Copper is particularly desirable since it is low in cost as well as in electric resistance. The thin metal wire may be formed from an alloy of the metals given in the above. If desired, the thin metal wire may have on its surface a thin metal layer or resin layer for anticorrosion, antioxidization, improvement of adhesion to electroconductive resin, enhanced electric conductance, etc. The surface metal layer is formed from, for example, noble metal resistant to corrosion such as silver, palladium, an alloy of silver and palladium, or gold, or other anticorrosion metal such as nickel or tin. Gold, silver, and tin are particularly preferable for the metal layer because they are hardly affected by humidity or the like. Plating or cladding can be given as an example of a method preferred to form the metal layer.

The thickness of the electroconductive resin coat of the thin metal wire is determined as desired but, if the thin metal wire is circular in section, the thickness of the coat is preferably 1% to 10% of the wire's diameter. The metal layer preferably has a specific resistance of $10^{-6}$ Ωcm or higher and 100 Ωcm or lower when the electric conductance, anticorrosion effect, and metal layer thickness are taken into consideration. The thin metal wire is preferably circular in section, but may be rectangular in section and a desired sectional shape can be chosen. The diameter of the thin metal wire is set such that the sum of electric resistance loss and shadow loss becomes minimum. To give a specific example, a copper wire having a diameter of 25 μm to 1 mm is preferably employed. Setting the wire diameter to 25 μm to 200 μm provides a highly efficient photovoltaic device and therefore is more desirable. If the thin metal wire is smaller than 25 μm in diameter, the wire is easily broken making it difficult to manufacture and increasing electric loss. On the other hand, if the thin metal wire is larger than 200 μm in diameter, shadow loss may be increased or the surface irregularities of the photovoltaic device may be increased necessitating thickening of EVA or like other filler in coating the device surface. The thin metal wire can be manufactured by shaping a wire material to have a desired diameter with the use of a known wiring roll. A thin metal wire processed by a wiring roll is hard and may be turned soft by a known annealing method in accordance with desired characteristics such as the ease of stretching or bending. Although any choice of thin metal wire type does not lead to loss of the effects of the present invention, the effects of the present invention are obtained to the fullest when a thin metal wire that is easily bent is used since the present invention is made to prevent a thin metal wire from being bonded by compression in a bent state to the principal surface of a photovoltaic member. A thin metal wire that is easy to bend has a sectional diameter of 10 to 200 μm and is formed from copper or silver. The risk of bowing and twisting a thin metal wire upon heating is high also when a core wire and its coat are made from metal of different thermal expansion coefficients.

(Photovoltaic Member)

A photovoltaic member has an effect of converting energy of incident light into electric power.

A photovoltaic member may consist solely of a photovoltaic layer, which converts light energy into electric power, or may be a complex of a photovoltaic layer, a substrate for maintaining the shape of the photovoltaic layer, an electrode layer for causing a current flow, a layer for reflecting light, and the like.

A photovoltaic layer in general is composed of a semiconductor junction. Semiconductors are roughly divided by material into silicon-based semiconductors and compound semiconductors typical examples of which include gallium arsenide and cadmium sulfide. Semiconductors can also be classified by junction's band structure into a pn junction type (a simple junction between a p type semiconductor and an n type semiconductor that are homogeneous), a heterogeneous junction type (a junction between heterogeneous semiconductors having different forbidden bandwidths), and a Schottky barrier type (a junction between a semiconductor and a metal). It is also possible to classify semiconductors by crystal structure, and there are crystalline semiconductors and amorphous semiconductors. According to classification by layer structure, semiconductors with a single junction layer are called a single type, semiconductors with two junction layers overlapped serially are called a tandem type, and triple type semiconductors have three junction layers overlapped with one another.

Either an electroconductive substrate or an insulating substrate can be employed. A preferable electroconductive substrate is one made of metal such as stainless steel or aluminum. A glass substrate, a ceramic substrate, and a resin substrate can be given as examples of an insulating substrate.

A layer for causing a current flow is a transparent electroconductive oxide layer formed from ITO, $Sn_2O_3$, or the like when the layer is on the light incidence side of the photovoltaic member. On the other hand, when placed on the side opposite to the light incidence side, the layer is formed from silver, aluminum or the like to obtain high reflectance to solar light as well as high electroconductivity. It is known that a ZnO layer is preferably used as a layer for reflecting solar light.

Any choice of material, shape, and manufacturing method of photovoltaic layer does not lead to loss of the effects of the present invention related to a photovoltaic device manufacturing method. However, the effects of the present invention are more apparent in the case where a temperature rise of thin metal wires from the start of heating a photovoltaic member is rapid. Therefore, the present invention exerts its effects on a photovoltaic member that is small in heat capacity and high in heat conductivity. Particularly preferred is a photovoltaic member composed of a silicon semiconductor layer formed to a thickness of 100 nm to 10 μm on a metal substrate with a thickness of 5 to 500 μm.

(First Step)

The first step is a step of fixing thin metal wires, which are coated with electroconductive resin, to the principal surface of a photovoltaic member. The thin metal wires can be fixed to the principal surface of a photovoltaic member through resin, a low melting point metal, or the like, or by being pressed down by resin, a low melting point metal, or the like.

Known resin suitable to fix the thin metal wires is bonding resin or adhesive resin. Specific examples of bonding resin or adhesive resin include acrylic series, rubber series, silicone series, polyvinyl ether series, epoxy series, polyurethane series, nylon series, polyamide series, inorganic series, and a composite adhesive. Of those, an acrylic series adhesive and a silicone series adhesive are preferable because of their particularly superior adhesion, tackiness, retention, withstand voltage, moisture resistance, etc. The above adhesive may be put on a backing to obtain a single-sided or double-sided adhesive tape, which is enhanced in ease of handling and producibility. In this case, the backing is required to have resistance to heat for forming a collector electrode and is formed from polyimide or PET, for example. Known low melting point metals suitable to fix the thin metal wires include solder, tin, zinc, and indium.

The electroconductive resin coat of the thin metal wires may be removed to fix the thin metal wires directly to the photovoltaic member by welding, fusing, wire bonding, or the like.

An appropriate method is chosen from the above in accordance with the material of the principal surface of the photovoltaic member, the surface irregularities of the principal surface, and other factors.

The effects of the present invention will not be lost by choosing any one of those thin metal wire fixing methods. However, the present invention is effective when the fixing method chosen makes the thin metal wires easily bent. The present invention is particularly effective when the thin metal wires are fixed by a double-sided tape which is easy and simple.

(Second Step)

The photovoltaic member can be heated by a known method such as resistance heating, infrared heating, electromagnetic induction heating, oil heater heating, or hot air blow heating. Resistance heating is preferred since it is easy to control and is inexpensive. Resistance heating is also easy to measure the temperature for feedback control. In order to enhance the heating stability, an object having high heat capacity may be prepared as a hot bath which supplies heat. Any choice of heating method and heating direction does not lead to loss of the effects of the present invention. However, the effects of the present invention are more apparent when the method employed is one that allows the temperature to rise rapidly before the thin metal wires are pressed against the principal surface of the photovoltaic member by the elastic film. The present invention is particularly effective when the heating means employed is a resistance heater incorporated in a metal plate.

(Elastic Film)

The elastic film serves as a barrier separating the first gas pressure and the second gas pressure from each other, and also applies a pressure to the thin metal wires uniformly. Used as the elastic film is a film having excellent heat resistance and durability. An elastic material such as silicon rubber, fluorine rubber, or neoprene rubber is used to form the elastic film. The thickness of the elastic film can be set as desired but preferably is 500 μm to 2 mm. The elastic film may have on its surface an auxiliary film for preventing the electroconductive resin coat of the thin metal wires from adhering to the elastic film and for protecting the photovoltaic member against oil or the like that seeps from the elastic film upon heating. The auxiliary film is specifically a film of known polymer such as PTFE, ETFE, or PFA, and has a thickness of about 100 μm. Glass fiber immersed in such polymer materials may be used to enhance the strength of the elastic film. The force with which the elastic film presses the thin metal wires to the photovoltaic member can be adjusted by the difference in pressure between the first gas and the second gas. In this regard, the effects of the present invention can be obtained irrespective of the type of elastic film. However, the elastic film is preferably formed from a material having an appropriate modulus of elasticity such as PTFE, ETFE, or PFA to a thickness of 0.05 to 1 mm if the pressure difference between the first gas and the second gas is 0.01 to 0.5 MPa.

(Third Step)

A state in which the pressure of the first gas is larger than that of the second gas can be created by known methods such as one in which the first gas is introduced and pressurized by a pump through a valve in an airtight space which has the elastic film as its inner wall and whose volume is fixed, or one in which the first gas is introduced into an airtight space having the elastic film as its inner wall and then the volume of the airtight space is reduced, or one in which the first gas in an airtight space is heated. It is also possible to employ a method in which the pressure of the second gas is lowered by sucking with a vacuum pump the second gas in a quasi airtight space which has the elastic film as its inner wall and which has a limited number of gas entrance/exit. The pressure difference between the first gas and the second gas is set to an arbitrary level. Any choice of pressure difference setting method or pressure difference level does not impair the effects of the present invention. However, the pressure difference is preferably set to 0.01 to 0.5 MPa if the elastic film used is formed from a material having an appropriate modulus of elasticity such as PTFE, ETFE, or PFA to a thickness of 0.05 to 1 mm. Also, choosing a method in which the first gas is pressurized is preferred since that way no gas flow is caused in the second gas and accordingly unnecessary pressure to the thin metal wires can be avoided.

(First Sub-Step)

The intermediate region of the photovoltaic member can be elastically deformed by, for example, a method in which stress is applied to the photovoltaic member while fixing the photovoltaic member by a vacuum suction pad, a method in which a magnetic member is added to the photovoltaic member to apply stress to the photovoltaic member while the photovoltaic member is fixed by an electromagnet, a method in which stress is applied to the photovoltaic member through a member to which the photovoltaic member is fixed with an adhesive. Other various known methods can be employed as long as the effects of the present invention are obtained.

(Column)

The effect obtained from shaping the photovoltaic member along the outer wall of a column becomes larger as the column is reduced in diameter. However, excessive effect makes the force by which the thin metal wires are pressed against the photovoltaic member uneven and therefore is undesirable. Preferably, the column diameter is set such that the height of the concave portion of the photovoltaic member put on a flat plate is 1% to 20% of the width of the photovoltaic member. The column does not need to be a true column and may be deformed as long as the effects of the present invention are obtained. Also, the column does not need to be axially parallel to the longitudinal direction of the thin metal wires completely and may be shifted as long as the effects of the present invention are obtained.

(Photovoltaic Device)

A photovoltaic device is obtained by forming in a photovoltaic member an electrode through which electric power is taken out. A photovoltaic device of the present invention has an electrode formed from thin metal wires. The electrode formed from thin metal wires may be used in combination with an electrode obtained by printing electroconductive paste, an electrode obtained by fixing metal foil, an electrode formed into a film through deposition of a metal material by evaporation, sputtering, or the like, an electrode obtained by printing of a low melting point metal such as solder and subsequent reflow.

Embodiments of a second aspect of the present invention will be described below.

Figure 16A:
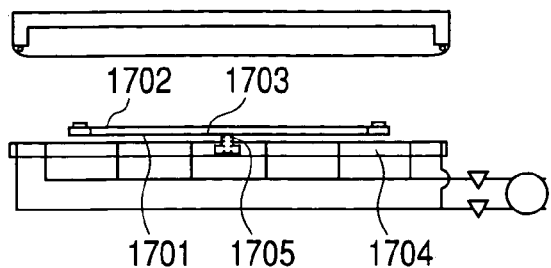
FIGS. 16AX, 16BX, 16CX, 16DX, 16AY, 16BY, 16CY and 16DY are diagrams illustrating the related art.
Figure 16A:
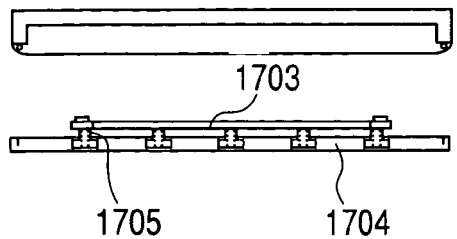
Figure 16B:
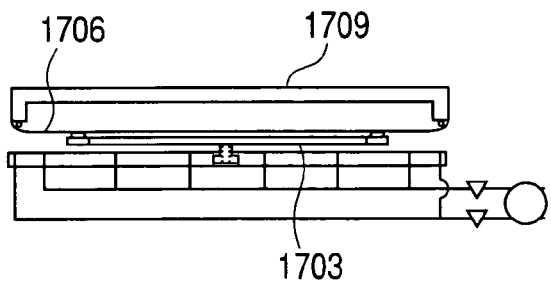
Figure 16B:
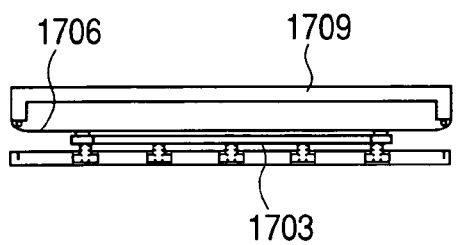

FIGS. 18A to 18D are diagrams illustrating a first embodiment. FIGS. 18A to 18D schematically show the present invention. Similar to FIGS. 17A to 17D, FIGS. 18A to 18D correspond to FIGS. 16AY to 16DY.

Figure 17A:
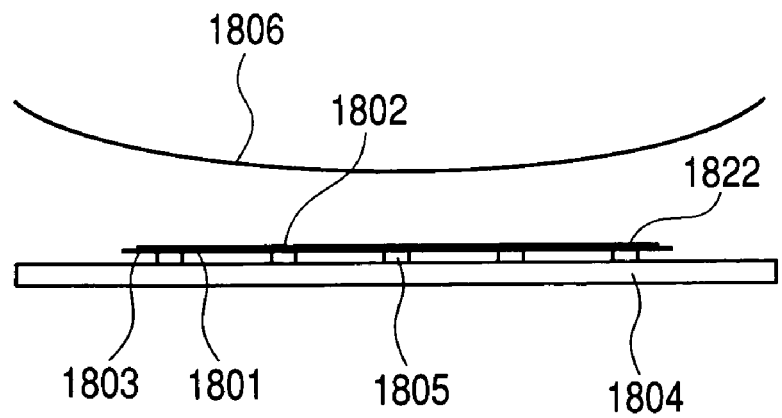
FIGS. 17A, 17B, 17C and 17D are diagrams illustrating an embodiment of the second aspect of the present invention.
Figure 17B:
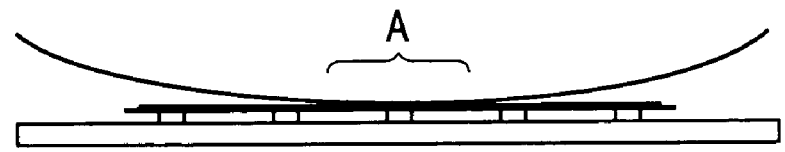
Figure 17C:
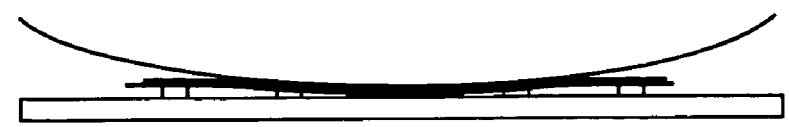
Figure 17D:
Figure 18A:
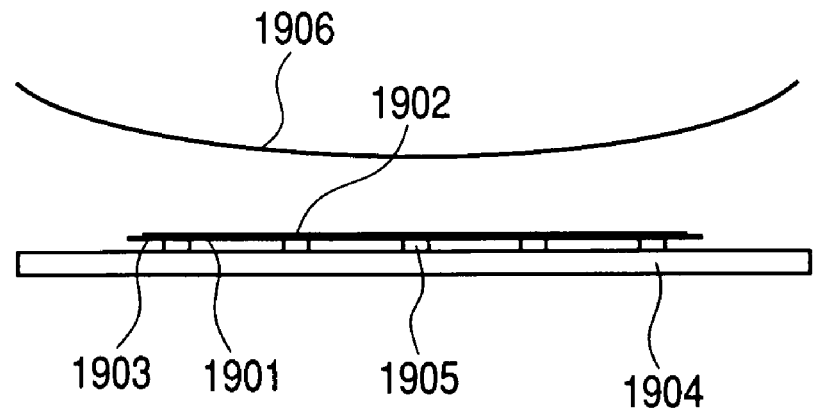
FIGS. 18A, 18B, 18C and 18D are diagrams illustrating an embodiment of the second aspect of the present invention.
Figure 18B:
Figure 18C:
Figure 18D:
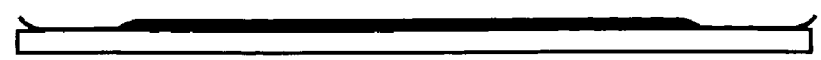
Figure 19A:
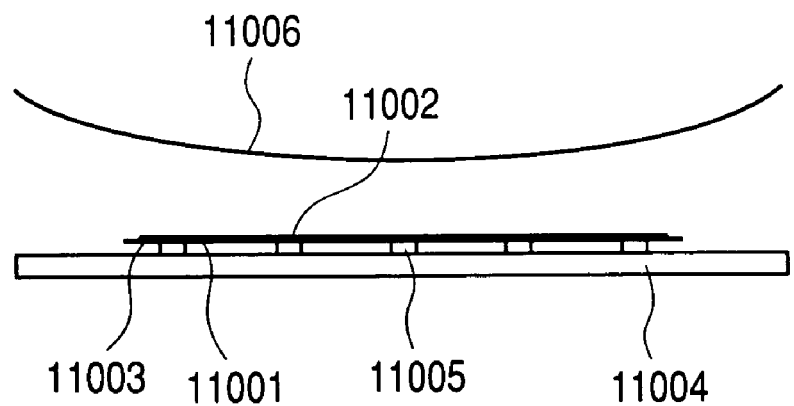
FIGS. 19A, 19B, 19C and 19D are diagrams illustrating an object of the second aspect of the present invention.
Figure 19B:
Figure 19C:
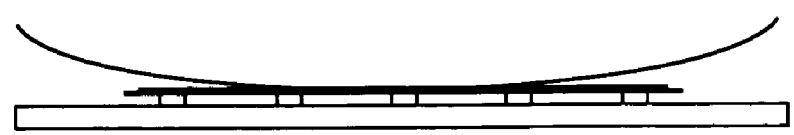
Figure 19D:

The embodiment of FIGS. 18A to 18D does not include a stage corresponding to the one shown in FIG. 17C since movable support members 1905 are pulled under a heat plate 1904 before an elastic sheet 1906 is brought into contact with a complex 1903. A tensile force applied to thin metal wires 1902 can therefore be prevented from being eased. However, the complex 1903 comes into contact with the heat plate 1904 at the stage of FIG. 18B, thereby starting heating of the complex 1903 for real before the thin metal wires 1902 are fixed onto a photovoltaic member 1901. If heating proceeds while the thin metal wires 1902 are not pressed against the photovoltaic member 1901, the tensile force applied to the thin metal wires 1902 could be eased by thermal expansion of the thin metal wires 1902, weakening of bond between the ends of the wires and the photovoltaic member, and the like. Therefore, pulling the movable support members 1905 under the heat plate 1904 is preferably carried out immediately before the elastic sheet 1906 is brought into contact with the photovoltaic member 1901. More specifically, it is preferable to prevent the temperature of the complex 1903 from exceeding 50% of the temperature of the heat plate 1904 from the time the complex 1903 comes into contact with the heat plate 1904 to the time the elastic sheet 1906 comes into contact with the complex 1903.

FIGS. 19A to 19D show another embodiment of the present invention. Similar to FIGS. 17A to 17D, FIGS. 19A to 19D correspond to FIGS. 16AY to 16DY.

In the embodiment shown in FIGS. 19A to 19D, movable support members 11005 are provided in a heat plate 11004. The movable support members 11005 in FIGS. 19A to 19D are simultaneously pulled under the heat plate 11004 in conjunction with one another by means not shown in the drawings. The movable support members 11005 which sink in conjunction with one another make it possible to prevent concave deformation of the central portion of a complex 11003 and to keep the central portion flat. Therefore, a tensile force applied to thin metal wires 11002 is not eased and the thin metal wires 11002 are prevented from bending.

Figure 20A:
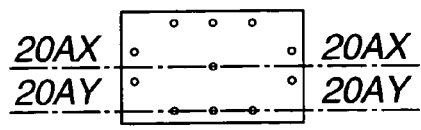
FIGS. 20A, 20B, 20C, 20D, 20E, 20AX, 20BX, 20CX, 20DX, 20EX, 20AY, 20BY, 20CY, 20DY and 20EY are diagrams illustrating an example of the second aspect of the present invention, FIG. 20AX being a sectional view taken along the line 20AX—20AX in FIG. 20A, FIG. 20AY being a sectional view taken along the line 20AY—20AY in FIG. 20A, FIG. 20BX being a sectional view taken along the line 20BX—20BX in FIG. 20B, FIG. 20BY being a sectional view taken along the line 20BY—20BY in FIG. 20B, FIG. 20CX being a sectional view taken along the line 20CX—20CX in FIG. 20C, FIG. 20CY being a sectional view taken along the line 20CY—20CY in FIG. 20C, FIG. 20DX being a sectional view taken along the line 20DX—20DX in FIG. 20D, FIG. 20DY being a sectional view taken along the line 20DY—20DY in FIG. 20D, FIG. 20EX being a sectional view taken along the line 20EX—20EX in FIG. 20E, FIG. 20EY being a sectional view taken along the line 20EY—20EY in FIG. 20E.
Figure 20A:
Figure 20A:
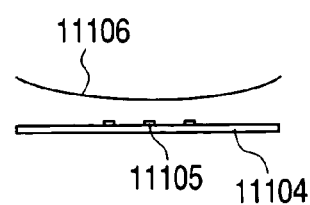
Figure 20B:
Figure 20B:
Figure 20B:
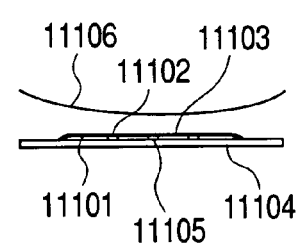
Figure 20C:
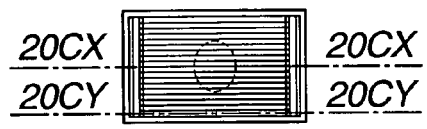
Figure 20C:
Figure 20C:
Figure 20D:
Figure 20D:
Figure 20D:
Figure 20E:
Figure 20E:
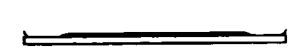
Figure 20E:

FIGS. 20A to 20E, FIGS. 20AX to 20EX, and FIGS. 20AY to 20EY show still another embodiment of the present invention. Similar to FIGS. 17A to 17D, FIGS. 20AX to 20DY correspond to FIGS. 16AX to 16DX and FIGS. 16AY to 16DY. As shown in the drawings, a complex 11103 is held in a manner that places the edges of the complex 11103 on a lower plane than the central portion of the complex 11103. This makes it possible to apply an appropriate tensile force to thin metal wires 11102 fixed to a surface of the complex 11103. More desirably, the tensile force applied to the thin metal wires 11102 is enhanced by making edges of the complex 11103 convex on the light receiving side. The tensile force acts to keep the thin metal wires 11102 taut and thus can prevent the thin metal wires 11102 from bending.

The complex 11103 can be made convex on the light receiving side by providing, at least, a support member in the central portion on a side of the complex 11103 that is opposite the light receiving side while no support members are provided in other regions than the central portion, or if provided, support members in other regions than the central portion are small in number and/or shorter than the one provided in the central portion. For instance, support members are arranged throughout the complex 11103 except the four corners of the complex 11103, or support members for supporting the vicinity of the edges are given supporting power inferior to that of support members for supporting the central portion as shown in FIGS. 20AX to 20EY and FIGS. 20AY to 20EY. The central portion refers to a region where the elastic sheet is in contact with the complex when the elastic sheet comes into contact with the complex starting deformation of the complex.

The terms used in the above are described below.

(Photovoltaic Member)

A photovoltaic member has an effect of converting energy of incident light into electric power.

A photovoltaic member may consist solely of a photovoltaic layer, which converts light energy into electric power, or may be a complex of a photovoltaic layer, a substrate for maintaining the shape of the photovoltaic layer, an electrode layer for causing a current flow, a layer for reflecting light, and others. In the present invention, greater effects are expected from a photovoltaic member that has a highly conductive thin substrate and the present invention is preferably applied to this type of photovoltaic member.

A photovoltaic layer in general is composed of a semiconductor junction. Semiconductors are roughly divided by material into silicon-based semiconductors and compound semiconductors typical examples of which include gallium arsenide and cadmium sulfide. Semiconductors can also be classified by junction's band structure into a pn junction type (a simple junction between a p type semiconductor and an n type semiconductor that are homogeneous), a heterogeneous junction type (a junction between heterogeneous semiconductors having different forbidden bandwidths), and a Schottky barrier type (a junction between a semiconductor and a metal). It is also possible to classify semiconductors by crystal structure, and there are crystalline semiconductors and amorphous semiconductors. According to classification by layer structure, semiconductors with a single junction layer are called a single type, semiconductors with two junction layers overlapped serially are called a tandem type, and triple type semiconductors have three junction layers overlapped with one another.

Either an electroconductive substrate or an insulating substrate can be employed. A preferable electroconductive substrate is one made of metal such as stainless steel or aluminum. A glass substrate, a ceramic substrate, and a resin substrate can be given as examples of an insulating substrate.

A layer for causing a current flow is a transparent electroconductive oxide layer formed from ITO, $Sn_2O_3$, or the like when the layer is on the light incidence side of the photovoltaic member. On the other hand, when placed on the side opposite to the light incidence side, the layer is formed from silver, aluminum or the like to obtain high reflectance to solar light as well as high electroconductivity. It is known to use a ZnO layer as a layer for reflecting solar light.

Any choice of material and shape of photovoltaic layer does not lead to loss of the effects of the present invention related to a photovoltaic device manufacturing method.

(Thin Metal Wire)

A wire material supplied industrially and stably is preferred for the thin metal wire, and it is desirable to choose metal having a specific resistance of $10^{-4}$ Ωcm or less as a metal member for forming the thin metal wire. For example, copper, silver, gold, platinum, aluminum, molybdenum, and tungsten are preferred because of their small specific resistance. Copper is particularly desirable since it is low in cost as well as in electric resistance. The thin metal wire may be formed from an alloy of the metals given in the above. If desired, the thin metal wire may have on its surface a thin metal layer or resin layer for anticorrosion, antioxidization, enhanced electric conductance, etc. The surface metal layer is formed from, for example, noble metal resistant to corrosion such as silver, palladium, an alloy of silver and palladium, or gold, or other anticorrosion metal such as nickel or tin. Gold, silver, and tin are particularly preferable for the metal layer because they are hardly affected by humidity or the like. Plating or cladding can be given as an example of a method preferred to form the metal layer.

The thickness of the electroconductive resin coat of the thin metal wire is determined as desired but, if the thin metal wire is circular in section, the thickness of the coat is preferably 1% to 10% of the wire's diameter. The metal layer preferably has a specific resistance of $10^{-6}$ Ωcm or higher and 100 Ωcm or lower considering the electric conductance, anticorrosion effect, and metal layer thickness. The thin metal wire is preferably circular in section, but may be rectangular in section and a desired sectional shape can be chosen. The diameter of the thin metal wire is set such that the sum of electric resistance loss and shadow loss becomes minimum. The thin metal wire can be manufactured by shaping a wire material to have a desired diameter with the use of a known wiring roll. A thin metal wire processed by a wiring roll is hard and may be turned soft by a known annealing method in accordance with desired characteristics such as the ease of stretching or bending. Although any choice of thin metal wire type does not lead to loss of the effects of the present invention, the effects of the present invention are obtained to the fullest when a thin metal wire that is easily bent is used since the present invention is made to prevent a thin metal wire from being bonded by compression in a bent state to the principal surface of a photovoltaic member. A thin metal wire that is easily bent is formed from copper or silver. The risk of bowing and twisting a thin metal wire upon heating is high also when a core wire and its coat are made from metal of different thermal expansion coefficients.

(Complex)

The complex is obtained by fixing ends of the thin metal wires to the photovoltaic member.

The present invention is about a method of bonding thin metal wires by thermocompression, and needs a member that exerts a bonding function on photovoltaic member or thin metal wires, or both, to perform thermocompression bonding of the photovoltaic member and the thin metal wires. The member that has a bonding function is preferably solder or other low melting point metals or electroconductive resin. Electroconductive resin can be placed on the photovoltaic member by a known method in which resin dispersed with fine powder of a low melting point metal is spread over the photovoltaic member by screen printing, a dispenser, or the like. To put electroconductive resin on the surfaces of the thin metal wires, the resin is applied to the surfaces of the thin metal wires by a roller or spraying, for example. The thin metal wires to which the resin is applied may be wringed with felt and a dice to be dried in a furnace. A low melting point metal can be put on the thin metal wires by, for example, hot-dip plating. Here, electroconductive resin refers to one obtained by dispersing electroconductive filler in binder resin. Examples of the filler include powder of silver, copper, or like other metals, powder of ITO, ZnO, $SnO_2$, $In_2O_3$, $TiO_2$, or like other oxides, carbon powder, and graphite powder. The binder resin is preferably resin that is easy to form a coat for a thin metal wire, is easy to handle, has flexibility, and is highly weatherproof. Specifically, a preferable binder resin material is thermosetting resin such as urethane resin, epoxy resin, phenol resin, polyvinyl formal resin, and alkyd resin, or resin obtained by altering these listed above. In particular, urethane resin, epoxy resin and phenol resin are used as an insulative coating material for enamel wires and are superior in flexibility and producibility. Furthermore, their moisture resistance and adhesion make them preferable as a collector electrode material for a photovoltaic device. It is also possible to employ thermoplastic resin such as phenoxy resin, polyamide resin, polyamide imide resin, melamine resin, butyral resin, acrylic resin, styrene resin, polyester resin, and fluorocarbon resin. Of these selections of thermoplastic resin, butyral resin, phenoxy resin, polyamide resin, and polyamide imide resin are materials superior in flexibility, moisture resistance, and adhesion, which makes them preferable as a collector electrode material for a photovoltaic device. The effects of the present invention can be obtained irrespective of the type of electroconductive resin used.

The ends of the thin metal wires can be fixed to the principal surface of the photovoltaic member by interposing resin, a low melting point metal, or the like between the thin metal wires and the photovoltaic member, or by using resin, a low melting point metal, or the like to press the thin metal wires against the photovoltaic member.

Known resin suitable to fix the thin metal wires is bonding resin or adhesive resin. Specific examples of bonding resin or adhesive resin include acrylic series, rubber series, silicone series, polyvinyl ether series, epoxy series, polyurethane series, nylon series, polyamide series, inorganic series, and a composite adhesive. Of those, an acrylic series adhesive and a silicone series adhesive are preferable because of their particularly superior adhesion, tackiness, retention, withstand voltage, moisture resistance, etc. The above adhesive may be put on a backing to obtain a single-sided or double-sided adhesive tape, which is enhanced in ease of handling and producibility. In this case, the backing is required to have resistance to heat for forming a collector electrode and is formed from polyimide or PET, for example.

Known low melting point metals suitable to fix the thin metal wires include solder, tin, zinc, and indium.

When the thin metal wires are coated with electroconductive resin, their electroconductive resin coats may be removed to fix the thin metal wires directly to the photovoltaic member by welding, fusing, wire bonding, or the like.

An appropriate method is chosen from the above in accordance with the material of the principal surface of the photovoltaic member, the surface irregularities of the principal surface, and other factors.

(Heat Plate)

The heat plate is a plate-like member which is heated. Examples of a heat plate material include metal, resin, ceramic, and glass. The plate-like member is heated by a known method such as resistance heating, infrared heating, electromagnetic induction heating, oil heater heating, or hot air blow heating. Resistance heating is preferred since it is easy to control and is inexpensive. Resistance heating is also easy to measure the temperature for feedback control. In order to enhance the heating stability, an object having high heat capacity may be prepared as a hot bath which supplies heat. Any choice of heating method and heating direction does not lead to loss of the effects of the present invention. However, the effects of the present invention are more apparent when the method employed is one that allows the temperature to rise rapidly before the thin metal wires are pressed against the principal surface of the photovoltaic member by the elastic film. The present invention is particularly effective when the heating means employed is a resistance heater incorporated in a metal plate.

The heat plate may have an air suction hole opened or an electromagnet buried to make the complex stuck to the heat plate.

(Movable Support Member)

Figure 12A:
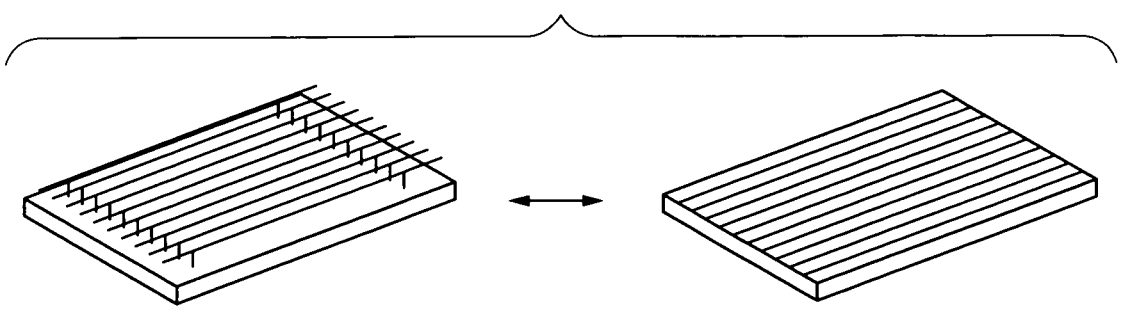
FIGS. 12A, 12B, 12C and 12D are diagrams illustrating an embodiment of the second aspect of the present invention.
Figure 12B:
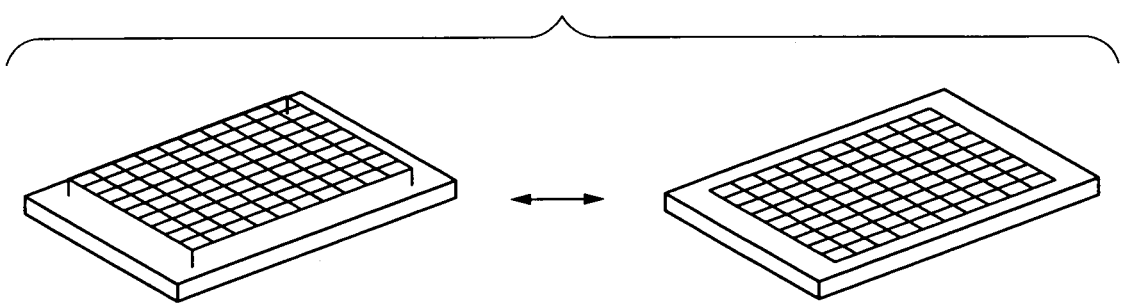
Figure 12C:
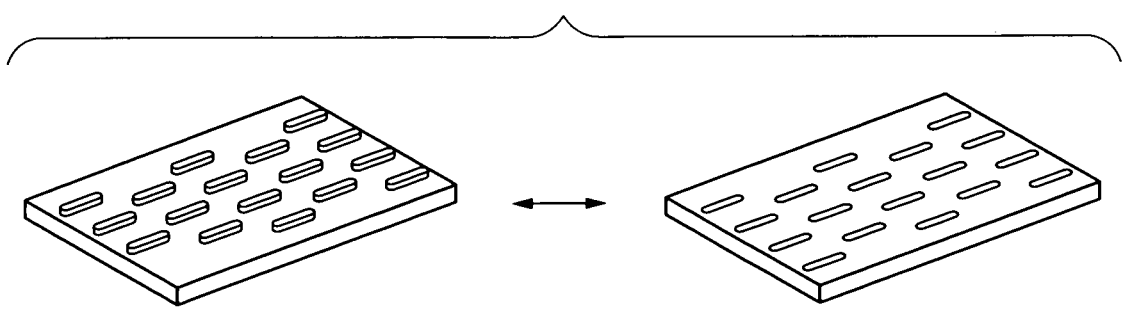
Figure 12D:
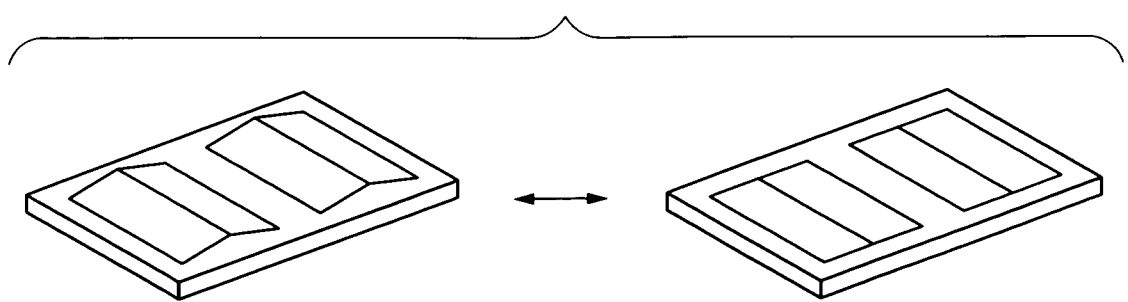

The movable support members are set to protrude from the principal surface of the heat plate and can be moved to sink in the heat plate. The movable support members have an effect of pushing the complex away from the top face of the heat plate in order to make it easy for an automatic hand or like other instruments to place the complex on the heat plate and to lift the complex away from the heat plate. The movable support members may be formed from resin, metal, ceramic, glass, or the like, and a material that is small in heat conductivity is preferred to delay heating of the complex. From the same reason, the movable support members are shaped to reduce the contact area between the movable support members and the complex as much as possible. The contact between the movable support members and the complex is desirably line contact or point contact rather than surface contact. For instance, the movable support members may be linear bodies as shown in FIG. 12A, or mesh-like as shown in FIG. 12B, or like pins as shown in FIG. 12C, or like folding panels as shown in FIG. 12D. If a pin-like shape is chosen as shown in FIG. 12C, columnar pins, conical pins, dome-like pins, or other known pins can be employed.

A fixing mechanism which uses suction or adhesion may be provided in order to fix the photovoltaic member more securely. If the photovoltaic member is magnetic, magnets can serve as the movable support members.

A known source of power suitable to move the movable support members is one that utilizes the elasticity of metal or resin. Specific examples thereof include springs and leaf springs made of metal or resin. A cylinder structure which utilizes gas or liquid may be employed instead of springs. Metal springs, which are inexpensive and easy to use, are particularly desirable. Alternatively, the movable support members may be driven magnetically.

(Elastic Sheet)

Used as the elastic sheet is a sheet having excellent heat resistance and durability. An elastic material such as silicon rubber, fluorine rubber, or neoprene rubber is used to form the elastic sheet. The thickness of the elastic sheet can be set as desired but preferably is 500 µm to 2 mm. The elastic sheet may have on its surface an auxiliary sheet for preventing the electroconductive resin coat of the thin metal wires from adhering to the elastic sheet and for protecting the photovoltaic member against oil or the like that seeps from the elastic sheet upon heating. The auxiliary sheet is specifically a sheet of known polymer such as PTFE, ETFE, or PFA, and has a thickness of about 100 µm. Glass fiber immersed in such polymer materials may be used to enhance the strength of the elastic sheet. The force with which the elastic sheet presses the thin metal wires to the photovoltaic member can be adjusted by the difference in pressure between the first gas and the second gas. In this regard, the effects of the present invention can be obtained irrespective of the type of elastic sheet. However, the elastic sheet is preferably formed from a material having an appropriate modulus of elasticity such as PTFE, ETFE, or PFA to a thickness of 0.05 to 1 mm if the pressure difference between the first gas and the second gas is 0.01 to 0.5 MPa.

The pressure applied to a surface of the elastic sheet that is opposite the heat plate can be made larger than the pressure applied to a surface of the heat plate that faces the heat plate by known methods such as one in which gas is introduced and pressurized by a pump through a valve in an airtight space which has the elastic sheet as its inner wall and whose volume is fixed, or one in which gas is introduced into an airtight space having the elastic sheet as its inner wall and then the volume of the airtight space is reduced, or one in which gas in an airtight space is heated. The pressure difference is set to an arbitrary level. Any choice of pressure difference setting method or pressure difference level does not impair the effects of the present invention. However, the pressure difference is preferably set to 0.01 to 0.5 MPa if the elastic sheet used is formed from a material having an appropriate modulus of elasticity such as PTFE, ETFE, or PFA to a thickness of 0.05 to 1 mm.

(Photovoltaic Device)

A photovoltaic device is obtained by forming in a photovoltaic member an electrode through which electric power is taken out. A photovoltaic device of the present invention has an electrode formed from thin metal wires. The electrode formed from thin metal wires may be used in combination with an electrode obtained by printing electroconductive paste, an electrode obtained by fixing metal foil, an electrode formed into a film through deposition of a metal material by evaporation, sputtering, or the like, an electrode obtained by printing of a low melting point metal such as solder and subsequent reflow.

A detailed description will be given through Examples on a photovoltaic device manufacturing method according to the first aspect of the present invention.

EXAMPLE 1

FIGS. 1A to 1D show a photovoltaic device manufacturing method of this example, which will be described below with reference to the drawings.

(a) A photovoltaic member 101 was made by the following method:

A roll of stainless steel substrate formed from SUS 430 to a thickness of 0.15 mm was prepared and was subjected to surface washing to serve as a substrate of a photovoltaic member. Then a thin film of tungsten, silver, or zinc oxide was formed on a surface of the substrate (to a thickness of 1 µm or less) by a known sputtering method. A known electrocrystallization method was used to form a layer of zinc oxide with a thickness of about 2 µm, and then a known CVD method was used to form two layers of microcrystalline silicon layers, each of which was composed of an n layer, an i layer, and a p layer and had a thickness of about 3 µm, and to form an amorphous silicon layer, which was composed of an n layer, an i layer, and a p layer and had a thickness of 1 μm or less, thereby completing a photovoltaic layer. Lastly, an ITO layer with a thickness of 70 nm was formed by a known sputtering method. The substrate was then cut into pieces to obtain the photovoltaic member 101 (239 mm×356 mm). The photovoltaic member 101 was subjected to processing described below in order to avoid short circuit of the photovoltaic layer around the edges of the substrate.

First, paste containing an etchant ($FeCl_3$) for the ITO layer was put on a surface of the photovoltaic member 101 along the outer periphery of the substrate by screen printing. The substrate was then washed with pure water to remove a part of the ITO layer and ensure electric separation between an upper electrode, which was formed from the ITO layer, the substrate, and a lower electrode which was composed of tungsten, silver, or zinc oxide (FIG. 1A).

(b) Thin metal wires 102 coated with electroconductive resin were arranged and fixed onto the photovoltaic member 101 by the following method:

The thin metal wires 102 were prepared in a manner described below. Chosen as raw material was a copper wire which had a diameter of 4 to 5 mm and whose outer circumferential surface was covered with a silver foil having a thickness of 50 μm. The copper wire was shaped by a wiring roll into a core wire having a diameter of 100 μm. 500 g of the continuous core wire was wound around a bobbin. The thickness of a silver coat after the copper wire was shaped was about 1 μm. Next, a coat was formed around the core wire from resin that contains electroconductive filler by a roll coater device for enamel wire. The coat had a two-layer structure with a completely cured inner layer and an outer layer for fixing the thin metal wires 102 onto the photovoltaic layer by bonding. The inner layer was formed as follows:

First, the core wire was wound off the bobbin and put through an inner layer forming treatment tank. The inner layer forming treatment tank was composed of a rotary roll and a piece of felt. The rotary roll winds up resin containing filler for the inner layer. The core wire put through the inner layer forming treatment tank comes into contact with the rotary roll first. At this point, the resin wound up by the rotary roll is applied to the core wire. The core wire then comes into contact with the felt piece, and excess resin is removed upon contact. Next, the core wire reaches a heating furnace, where the applied resin is completely cured. In order to ensure that the resin is applied evenly, the series of steps of application, removal, and curing was repeated several times. As the core wire to which the resin was applied was wound, the outer diameter of the core wire was measured and the measurement was fed back to adjust the viscosity of the resin. Based on the feedback, the viscosity of the resin was lowered to reduce the amount of resin wound up by the rotary roll and, as a result, the amount of resin applied as well. Xyelen, which is a solvent, was used to adjust the viscosity of the resin. The composition of the resin used was as follows:

Carbon black particles with a diameter of 30±20 nm were used as the filler, and were adjusted to have a volume density of 35%. The mixing ratio of the filler and the resin when the weight of a mixture to be obtained was set as 100 is: 6.4 parts by weight of butyral, 4.2 parts by weight of cresol resin, phenol resin, or aromatic hydrocarbon-based resin, 18 parts by weight of diol isocyanate as a curing agent, 18 parts by weight of xyelen as a solvent, 12 parts by weight of diethylene glycol monomethyl ether, 3.6 parts by weight of cyclohexane, and 0.7 parts by weight of γ-mercaptopropyltrimethoxysilane as a coupling agent. The components were mixed and dispersed in a paint shaker. The thus obtained inner layer of the coat was about 5 μm in thickness and about 0.5 Ωcm in resistance.

The outer layer was formed by a method described below. The core wire on which the inner layer had been formed by application was put through an outer layer forming treatment tank. The outer layer forming treatment tank is composed of a rotary roll and a dice. The rotary roll winds up resin containing filler for the outer layer. The core wire put through the outer layer forming treatment tank comes into contact with the rotary roll first. At this point, the resin wound up by the rotary roll is applied to the core wire. The core wire then passes through the dice to remove excess resin. Next, the core wire reaches a heating furnace, where a solvent of the applied resin is vaporized semi-curing the resin. In order to ensure that the resin is applied evenly, the series of steps of application, removal, and curing was repeated several times. The hole diameter of the dice was set to increase as the series of steps was repeated with the final thickness of the outer layer being 20 μm. The composition of the resin used was as follows:

Carbon black particles with a diameter of 30±20 nm were used as the filler. 35 parts by weight of carbon black, 41 parts by weight of urethane resin, 14 parts by weight of phenoxy resin, 6 parts by weight of diphenylmethane diisocyanate with hydrogen added to serve as a curing agent, 4 parts by weight of aromatic solvent as a solvent, and 0.7 parts by weight of γ-mercaptopropyltrimethoxysilane as a coupling agent were mixed and dispersed in a paint shaker. The thus obtained outer layer of the coat was about 0.5 Ωcm in resistance.

Secondly, the thus prepared wire was cut such that each of the thin metal wires 102 had a length of 350 mm. Bowing and twisting were corrected to make the thin metal wires 102 straight. To correct bowing and twisting, the thin metal wires 102 were passed between two rotary rollers which are made of rubber and are in contact with each other.

Figure 1B:
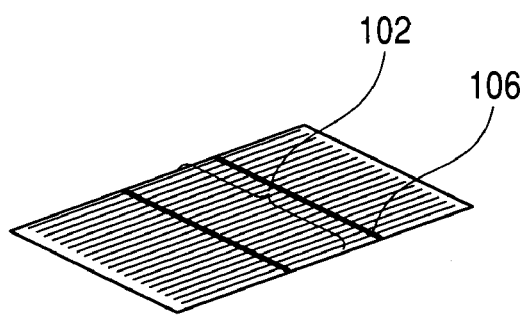

Thirdly, the straightened thin metal wires 102 were arranged on a surface of the photovoltaic member 101 in parallel to one another at regular intervals. Adhesive resin (Cemedine) 106 was applied onto the thin metal wires 102 to fix the thin metal wires 102 onto the photovoltaic member 101 (FIG. 1B).

(c) The photovoltaic member 101 that had finished step (b) was inserted in a device for bonding the thin metal wires 102 onto the photovoltaic member 101 by thermocompression.

Figure 1C:
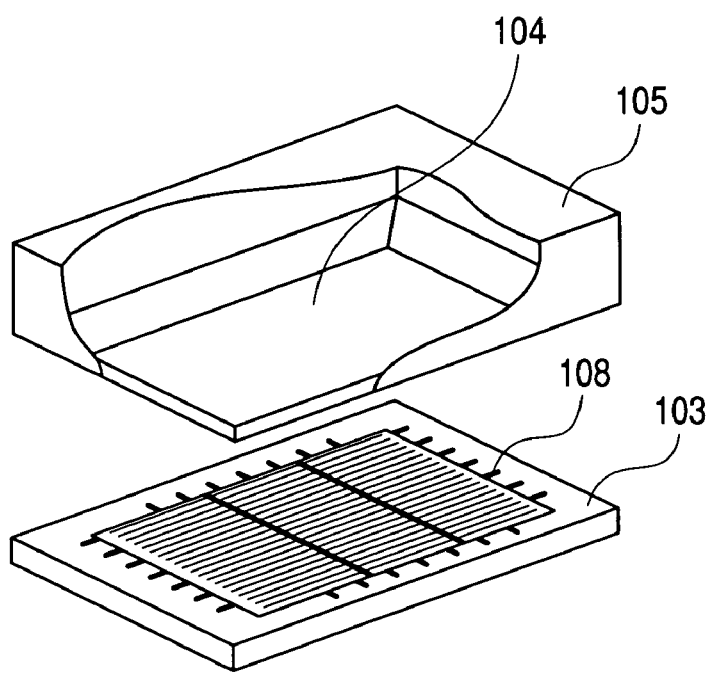

The above device is composed of an upper chamber 105 and a heat plate 103. The upper chamber 105 has an elastic film 104 tightly fit over the edges of an upturned metal box. Used as the elastic film 104 was a PTFE film with a thickness of about 50 μm. The upper chamber has a port (not shown in the drawings) through which air enters and exits the chamber, the upper chamber being highly airtight except at the portion of this port. The heat plate 103 is a metal plate with a heater (not shown in the drawings) incorporated. The heat plate 103 is always heated and kept at 210° C. The heat plate 103 has plural holes opened in its top face. The holes communicate with holes on the back side of the heat plate 103 piercing the heat plate 103. The holes has two uses: one is to suck the photovoltaic member 101 when the photovoltaic member 101 is placed on the top face of the heat plate 103 and the other is to suck the air immediately above the heat plate 103. From the instant the photovoltaic member 101 inserted in the heat plate 103 was put on the heat plate 103, the temperature of the photovoltaic member 101 started a slow rise. This is due to heat conduction in a contact area between the photovoltaic member 101 and the heat plate 103 and air convection between the photovoltaic member 101 and the heat plate 103. The pressure in the upper chamber at this point was set to 0.2 MPa (FIG. 1C).

(d) The upper chamber 105 was lowered to bond the thin metal wires 102 onto the photovoltaic member 101 by thermocompression.

Figure 1D:
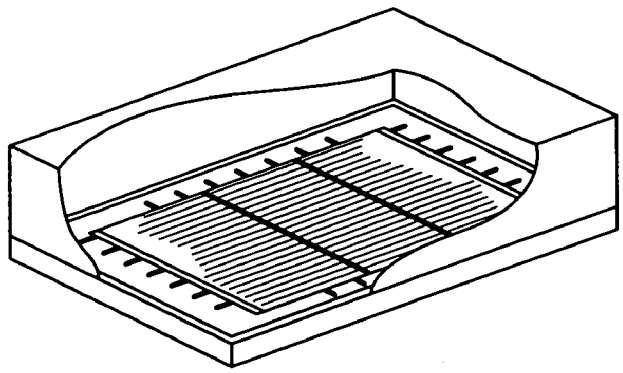
Figure 2A:
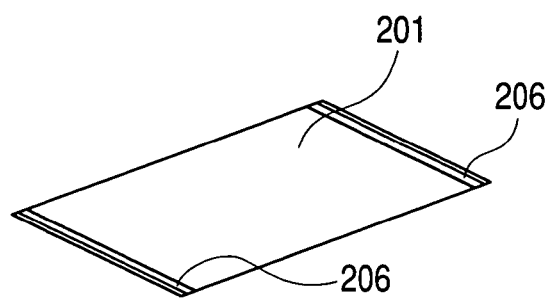
FIGS. 2A, 2B, 2C and 2D are diagrams illustrating another example of the first aspect of the present invention.
Figure 2B:
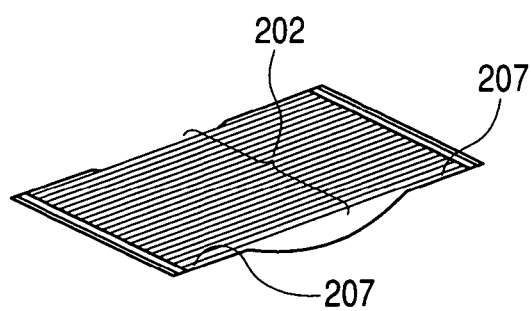
Figure 2C:
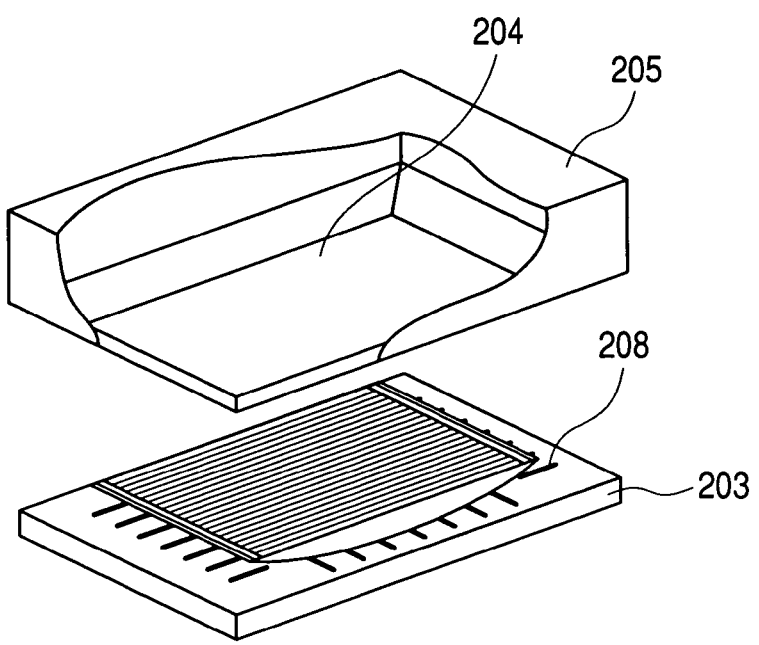
Figure 2D:
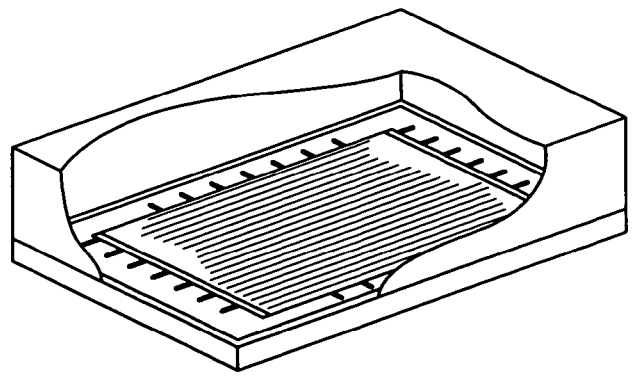
Figure 3A:
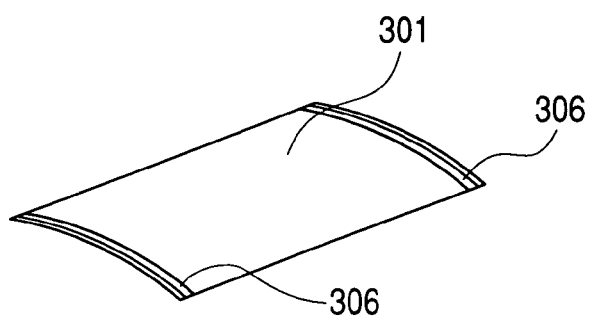
FIGS. 3A, 3B, 3C and 3D are diagrams illustrating still another example of the first aspect of the present invention.
Figure 3B:
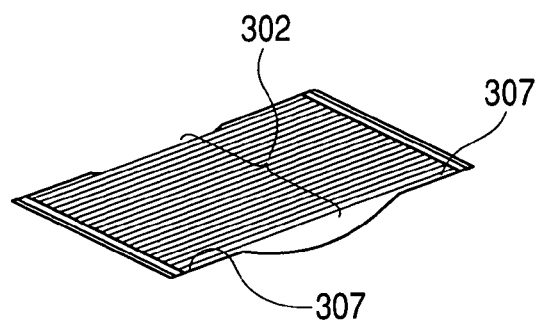
Figure 3C:
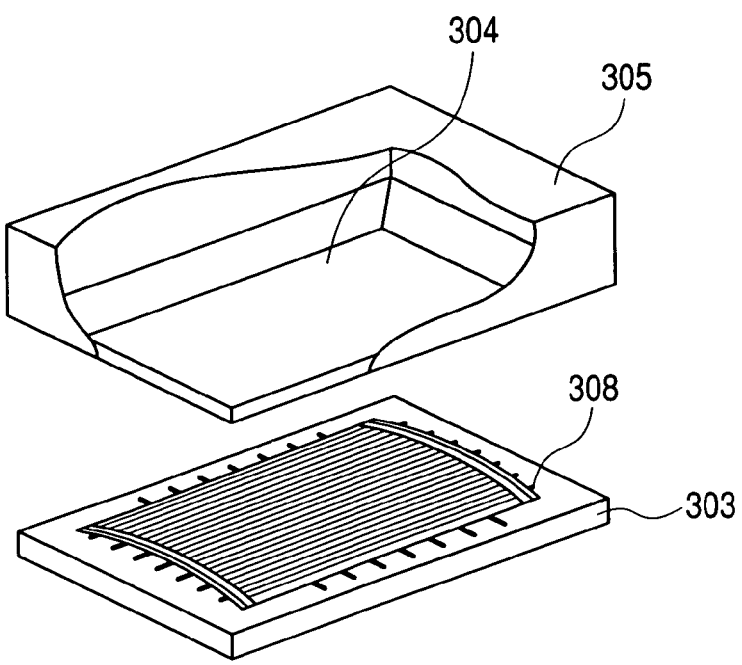
Figure 3D:
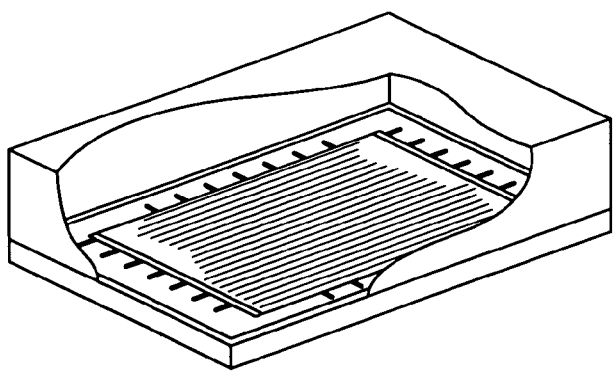

At about one second after the photovoltaic member 101 was put on the heat plate 103, the upper chamber was lowered while the internal pressure of the chamber was kept at 0.2 MPa. At the same time, air was sucked from holes 108 opened in the heat plate 103. The series of actions caused a rapid rise in temperature of the photovoltaic member 101. This is because the photovoltaic member 101 was pressed against the heat plate 103 by the elastic film 104, thereby increasing the contact area between the photovoltaic member 101 and the heat plate 103. The elastic film 104 was sandwiched between the edges of the metal box of the upper chamber and the top face of the heat plate 103. As a result, an airtight space was created between the bottom face of the elastic film 104 and the top face of the heat plate 103. The air remaining in the airtight space was sucked from the holes opened in the heat plate 103 to push the elastic film 104 downward. The pressure in the holes 108 at this point was about −80 kPa. Therefore, the elastic film 104 was pushed downward at 280 kPa, which was the pressure difference between the pressure applied to the top face of the elastic film 104 (0.2 MPa) and the pressure applied to the bottom face of the elastic film 104 (−80 kPa). At about 0.1 second after depression of the elastic film 104 was completed, the pressure in the upper chamber was returned to atmospheric pressure and this state was kept for 60 seconds. During this period, the thin metal wires 102 were bonded by thermocompression onto the photovoltaic member 101 by heat transmitted through the photovoltaic member 101 and by the pressure with which the elastic film 104 pressed the thin metal wires 102 against the top face of the photovoltaic member 101 (FIG. 1D).

When thermocompression bonding of the thin metal wires 102 onto the photovoltaic member 101 has been carried out several times by the method used above, the probability of the thin metal wires 102 undergoing bending to an extent greater than a certain degree was found to be 0.11%. The output of the thus obtained photovoltaic devices has been measured using an artificial solar light source (hereinafter referred to as simulator) having a light intensity of 100 mW/cm$^2$ at the AM 1.5 global solar light spectrum to obtain conversion efficiency. The result shows that photovoltaic devices whose thin metal wires were bent were about 1% lower in conversion efficiency than those in which thin metal wires were not bent at all.

EXAMPLE 2

A photovoltaic device manufacturing method of this example is shown in FIGS. 2A to 2D. In Example 1, the straightened thin metal wires 102 were arranged on a surface of the photovoltaic member 101 in parallel to one another at regular intervals, and the adhesive resin (Cemedine) 106 was applied onto the thin metal wires 102 to fix the thin metal wires 102 to the top face of the photovoltaic member 101. Example 2 took another approach in which the ends of the respective thin metal wires 202 were fixed by pieces of double-sided tape 206 to the ends of the principal surface of a photovoltaic member 201 while the central portion of the photovoltaic member 201 was made concave downward through elastic deformation. To make the central portion of the photovoltaic member 201 concave downward through elastic deformation, an electromagnet was fixed to the central portion from the back side and then pulled down while the edges of the photovoltaic member 201 were supported from below by a flat member (not shown). The electromagnet was pulled down by about 5 mm. The double-sided tape 206 used was obtained by applying a silicon-based adhesive to each side of a backing, which was composed of a 100-μm thick PET film and a 25-μm thick polyimide film bonded together by a silicon adhesive. After the ends of the thin metal wires 202 were bonded to the double-sided tape 206, a copper foil 207 having a thickness of 100 μm was attached to the ends of the thin metal wires 202 to serve as a bus bar electrode. The rest of this example was exactly the same as Example 1. Similar to Example 1, when thermocompression bonding of the thin metal wires 202 onto the photovoltaic member 201 has been carried out several times in order to obtain the probability of the thin metal wires 202 undergoing bending to an extent greater than a certain degree (the same criterion as Example 1). The probability thus obtained was found to be 0.05%. The output of the thus obtained photovoltaic devices has been measured using an artificial solar light source (hereinafter referred to as simulator) having a light intensity of 100 mW/cm$^2$ at the AM 1.5 global solar light spectrum to obtain conversion efficiency. The result shows that photovoltaic devices whose thin metal wires were bent had been about 1% lower in conversion efficiency than those in which thin metal wires were not bent at all.

EXAMPLE 3

A photovoltaic device manufacturing method of this example is shown in FIGS. 3A to 3D. The only difference between this example and Example 2 is that a photovoltaic member 301 of this example is shaped in advance along the outer wall of a column (see FIG. 3A). A known shaping machine was used to warp and convex the photovoltaic member 301 in the normal line direction of the principal surface of the photovoltaic member 301. The photovoltaic member 301 was warped to such a degree that the most elevated portion of the photovoltaic member 301 as placed on a planar surface was about 1 cm high. Thereafter, thin metal wires 302 were fixed to the principal surface of the photovoltaic member 301 such that the direction of the thin metal wires 302 was parallel to the axial direction of the column.

A photovoltaic member that is not warped like in Example 3 (e.g., the photovoltaic member shown in FIG. 2C) is readily bent in the direction along thin metal wires. The bending of the photovoltaic member along the thin metal wires causes a tensile force applied to the thin metal wires to have a vector directed to pull the thin metal wires away from the principal surface of the photovoltaic member. This weakens the bond between the photovoltaic member and the thin metal wires fixed to the photovoltaic member, increasing the risk of effecting thermocompression bonding of the thin metal wires in a bent state with respect to the principal surface of the photovoltaic member. In contrast, the photovoltaic member 301 of this example was warped and therefore was prevented from being bent in the direction along the thin metal wires 302.

Similar to Example 1, thermocompression bonding of the thin metal wires 302 onto the photovoltaic member 301 was carried out several times in order to obtain the probability of the thin metal wires 302 undergoing bending to an extent greater than a certain degree (the same as that in Example 1). The probability thus obtained was found to be 0.01%. The output of the thus obtained photovoltaic devices has been measured using an artificial solar light source (hereinafter referred to as simulator) having a light intensity of 100 mW/cm$^2$ at the AM 1.5 global solar light spectrum to obtain conversion efficiency. The result shows that photovoltaic devices whose thin metal wires were bent were about 1% lower in conversion efficiency than ones in which thin metal wires were not bent at all. The effects of shaping a photovoltaic member along the outer wall of a column and carrying out thermocompression bonding of the thin metal wires in the direction parallel to the axial direction of the column are apparent from comparison of this example to Example 2.

EXAMPLE 4

Figure 4A:
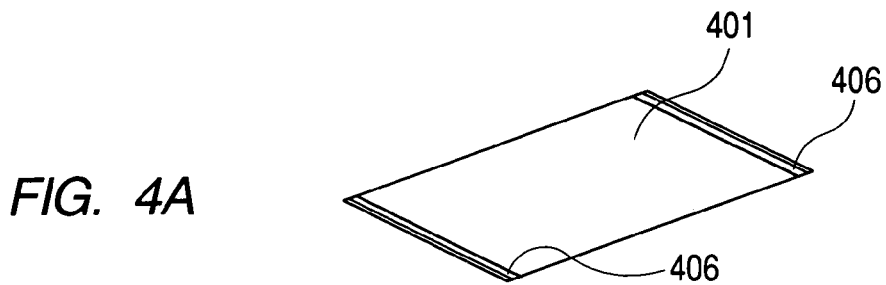
FIGS. 4A, 4B, 4C and 4D are diagrams illustrating yet still another example of the first aspect of the present invention.
Figure 4B:
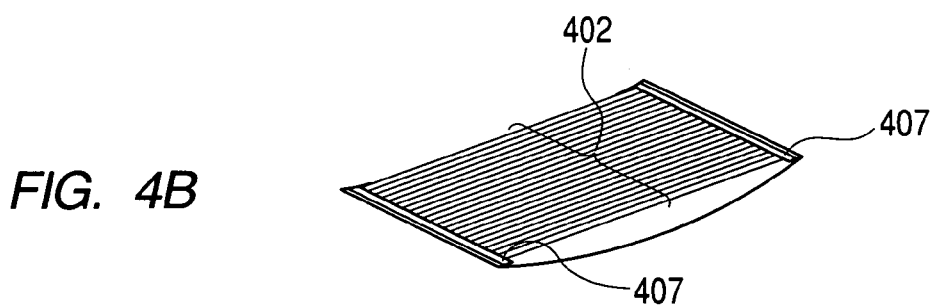
Figure 4C:
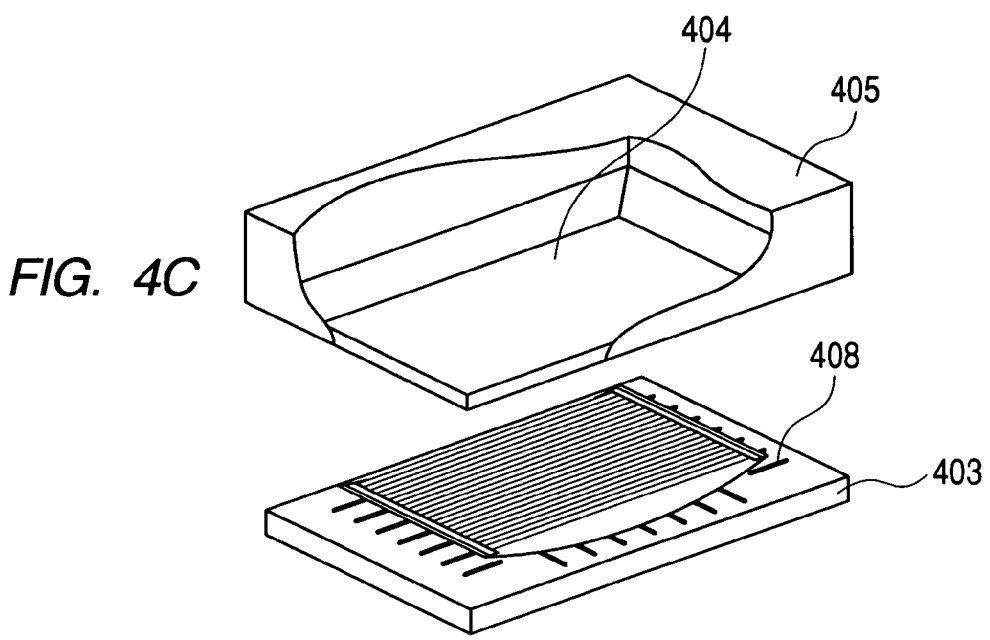
Figure 4D:
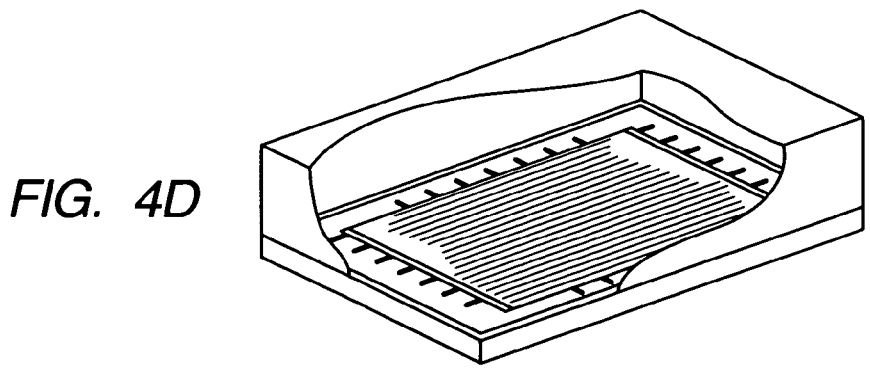
Figure 5A:
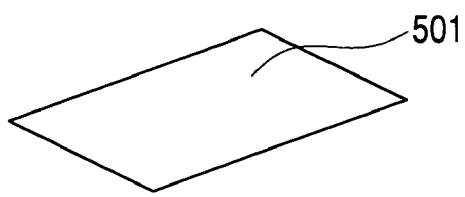
FIGS. 5A, 5B, 5C, 5D and 5E are diagrams illustrating a comparative example provided for comparison to the examples of the first aspect of the present invention.
Figure 5B:
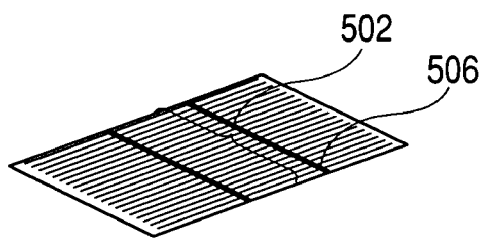
Figure 5C:
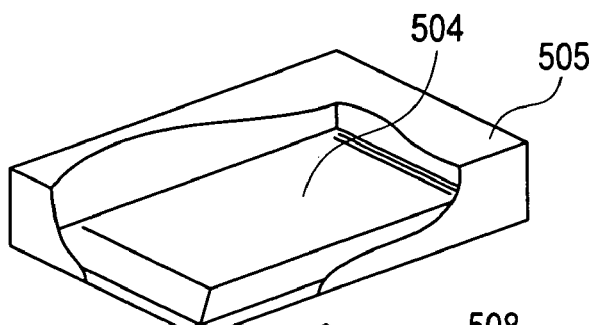
Figure 5D:
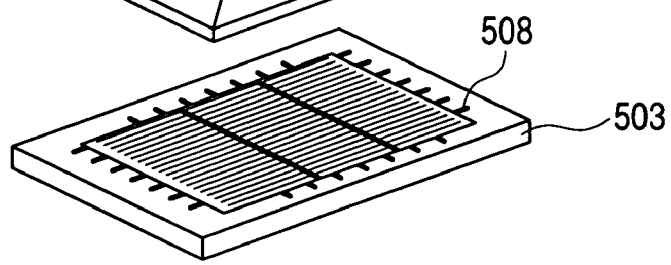
Figure 5D:
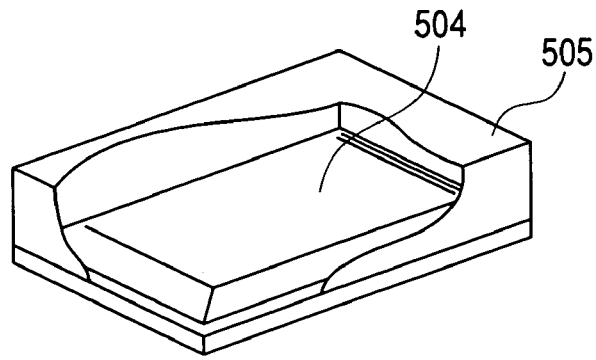
Figure 5E:
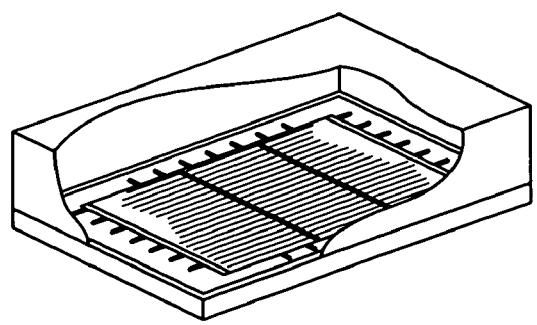

A photovoltaic device manufacturing method of this example is shown in FIGS. 4A to 4D. The only difference between this example and Example 2 is that, when fixing thin metal wires 402 of this example to the principal surface of a photovoltaic member 401, the entire photovoltaic member 401 is curved in the direction along thin metal wires 402 by a known method as shown in FIG. 4B.

Similar to Example 1, thermocompression bonding of the thin metal wires 402 onto the photovoltaic member 401 has been carried out several times in order to obtain the probability of the thin metal wires 402 undergoing bending to an extent greater than a certain degree (the same as that in Example 1). The probability is found to be 0.09%. The output of the thus obtained photovoltaic devices has been measured using an artificial solar light source (hereinafter referred to as simulator) having a light intensity of 100 mW/cm$^2$ at the AM 1.5 global solar light spectrum to obtain conversion efficiency. The result shows that photovoltaic devices whose thin metal wires were bent were about 1% lower in conversion efficiency than ones in which thin metal wires were not bent at all. The effect of elastically deforming only the central portion of a photovoltaic member when fixing thin metal wires onto the principal surface of the photovoltaic member is apparent from comparison of this example to Example 2.

Comparative Example 1

A photovoltaic device manufacturing method of this example is shown in FIGS. 5A to 5E. The only difference between this example and Example 1 is that an upper chamber of this example is lowered in FIG. 5C while the pressure is reduced to −80 kPa and that the internal pressure of the chamber is raised to 0.2 MPa in FIG. 5D.

Similar to Example 1, thermocompression bonding of the thin metal wires 502 onto the photovoltaic member 501 has been carried out several times in order to obtain the probability of the thin metal wires 402 undergoing bending to an extent greater than a certain degree (the same as that in Example 1) The probability thus obtained was found to be 3.25%. The output of the thus obtained photovoltaic devices has been measured using an artificial solar light source (hereinafter referred to as simulator) having a light intensity of 100 mW/cm$^2$ at the AM 1.5 global solar light spectrum to obtain conversion efficiency. The result shows that photovoltaic devices whose thin metal wires were bent have been about 1% lower in conversion efficiency than ones in which thin metal wires were not bent at all. The effect of the present invention is apparent from comparison of this example to Example 1.

A detailed description will be given through Examples on a method of manufacturing an electrode for a photovoltaic device according to the second aspect of the present invention.

EXAMPLE 5

Figure 10A:
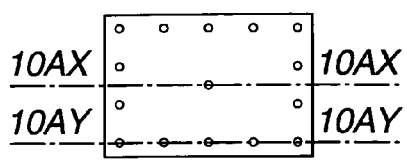
FIGS. 10A, 10B, 10C, 10D, 10E, 10F, 10AX, 10BX, 10CX, 10DX, 10EX, 10FX, 10AY, 10BY, 10CY, 10DY, 10EY and 10FY are diagrams illustrating an example of a second aspect of the present invention, FIG. 10AX being a sectional view taken along the line 10AX—10AX in FIG. 10A, FIG. 10AY being a sectional view taken along the line 10AY—10AY in FIG. 10A, FIG. 10BX being a sectional view taken along the line 10BX—10BX in FIG. 10B, FIG. 10BY being a sectional view taken along the line 10BY—10BY in FIG. 10B, FIG. 10CX being a sectional view taken along the line 10CX—10CX in FIG. 10C, FIG. 10CY being a sectional view taken along the line 10CY—10CY in FIG. 10C, FIG. 10DX being a sectional view taken along the line 10DX—10DX in FIG. 10D, FIG. 10DY being a sectional view taken along the line 10DY—10DY in FIG. 10D, FIG. 10EX being a sectional view taken along the line 10EX—10EX in FIG. 10E, FIG. 10EY being a sectional view taken along the line 10EY—10EY in FIG. 10E, FIG. 10FX being a sectional view taken along the line 10FX—10FX in FIG. 10F, FIG. 10FY being a sectional view taken along the line 10FY—10FY in FIG. 10F.
Figure 10A:
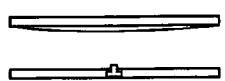
Figure 10A:
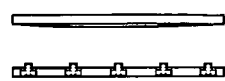

A photovoltaic device electrode manufacturing method of this example is shown in FIGS. 10A to 10F, FIGS. 10AX to 10FX, and FIGS. 10AY to 10FY. FIGS. 10A to 10F are diagrams showing the process of this example step-by-step. FIGS. 10A to 10F are plan views of a thermocompression bonding device. FIGS. 10AX to 10FX are sectional views taken along the lines 10AX—10AX to 10FX—10FX in FIGS. 10A to 10F. FIGS. 10AY to 10FY are sectional views taken along the lines 10AY—10AY to 10FY—10FY in FIGS. 10A to 10F. The device is simplified in the drawings, and a vacuum pump, pipes, a deaeration groove, suction holes, an O-ring, and others used here are identical to those employed in the related art example. Referring to the drawings, this example is described below.

FIG. 10A is a plan view of a heat plate 1104 of this example. As shown in the drawing, holes are provided in the heat plate 1104 of this example. Protruded from the holes in a surface of the heat plate 1104 are movable support members 1105. The movable support members 1105 are made of Teflon® resin and shaped like a hat with a brim as shown in the drawing. The crown of the hat is 10 mm in diameter. The movable support members 1105 are kept protruding upward by springs. The heat plate 1104 has suction holes (not shown in the drawing) for making a complex 1103 stuck to the heat plate 1104 and a deaeration groove (not shown in the drawing) for deaerating a space between an elastic sheet 1106 and the heat plate 1104. The heat plate 1104 of this example also has an electric heater (not shown) buried inside. The electric heater keeps the heat plate 1104 at a temperature of 210° C.

Figure 14A:
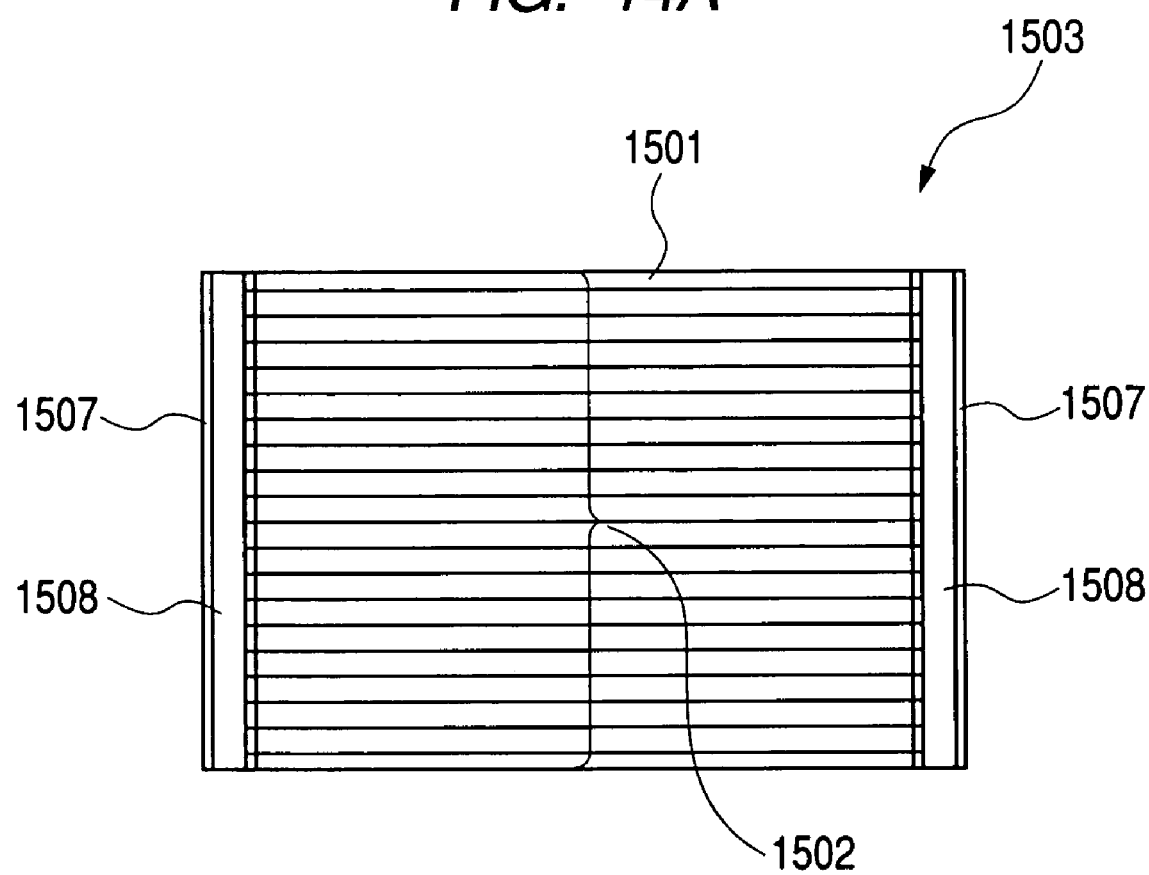
FIGS. 14A and 14B are diagrams illustrating a photovoltaic device.
Figure 14B:
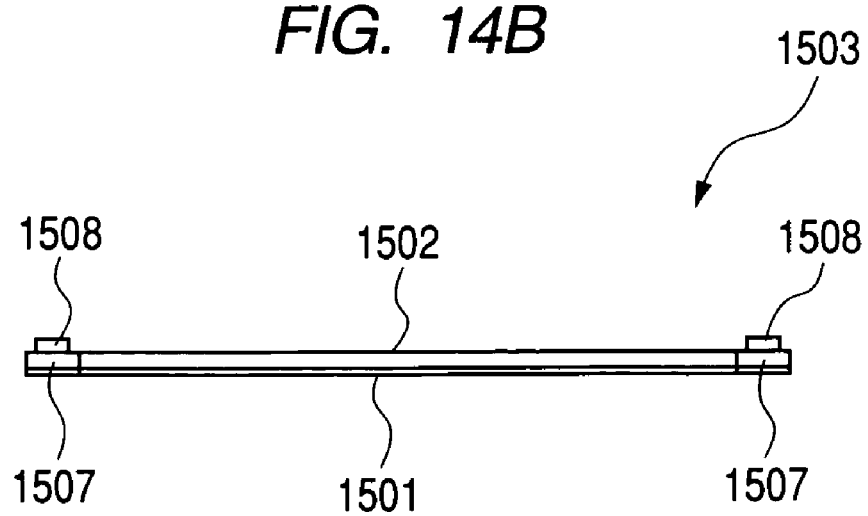
Figure 15A:
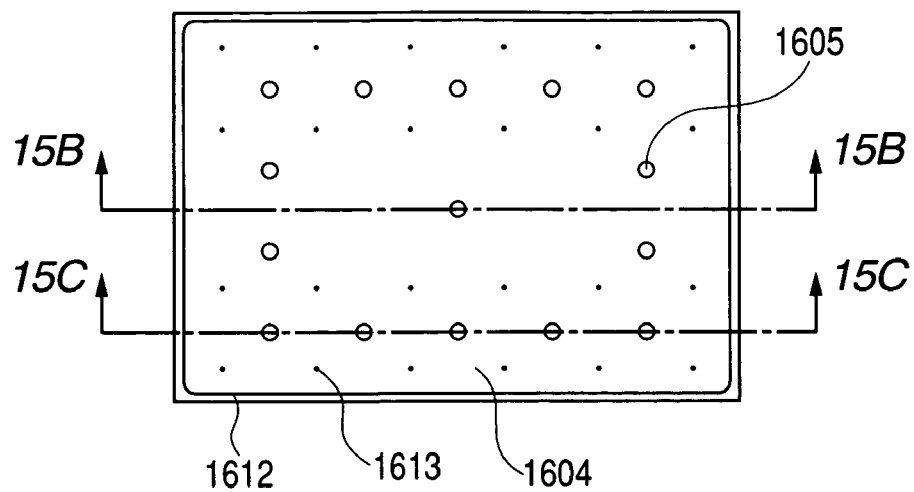
FIGS. 15A, 15B and 15C are diagrams illustrating the related art, FIG. 15A being a sectional view taken along the line 15A—15A in FIG. 15B, FIG. 15B being a sectional view taken along the line 15B—15B in FIG. 15A, FIG. 15C being a sectional view taken along the line 15C—15C in FIG. 15A.
Figure 15B:
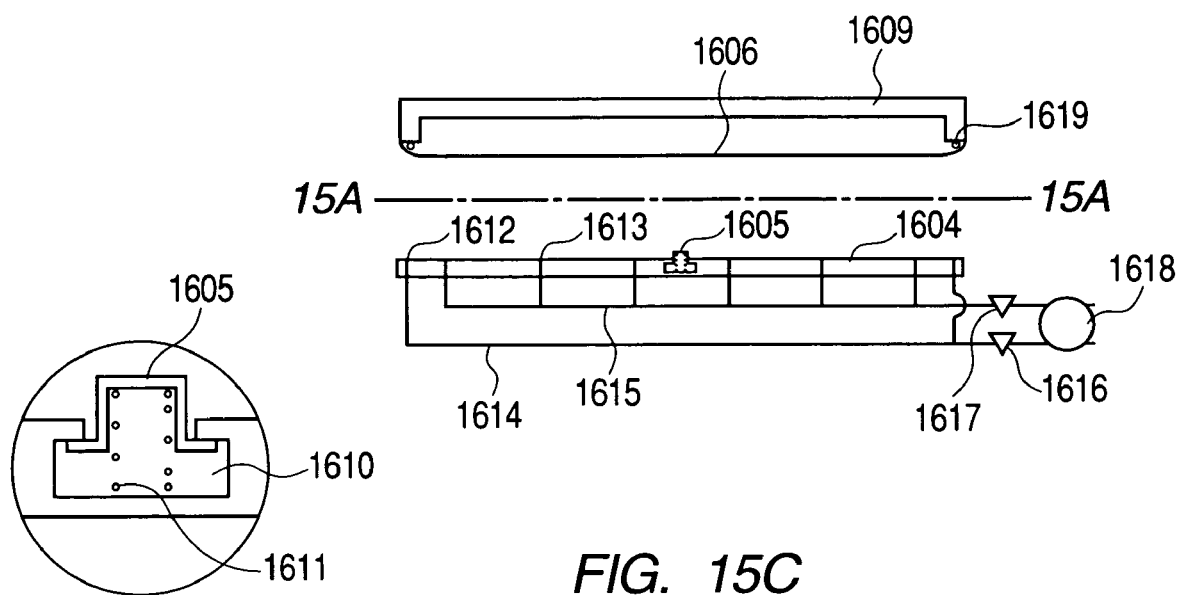
Figure 15C:
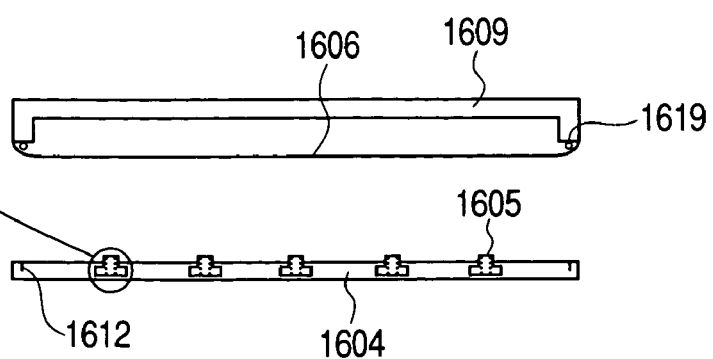

The complex 1103 of this example is identical to the one in FIGS. 14A and 14B.

The complex 1103 of this example was made by the following method:

First, a photovoltaic member 1101 of this example was prepared in a manner described below.

A roll of stainless steel substrate formed from SUS 430 to a thickness of 0.15 mm was prepared and was subjected to surface washing to serve as a substrate of a photovoltaic member. Then a thin film of tungsten, silver, or zinc oxide was formed on a surface of the substrate (to a thickness of 1 μm or less) by a known sputtering method. A known electrocrystallization method was used to form a layer of zinc oxide with a thickness of about 2 μm, and then a known CVD method was used to form two layers of microcrystalline silicon layers, each of which was composed of an n layer, an i layer, and a p layer and had a thickness of about 3 μm, and to form an amorphous silicon layer, which was composed of an n layer, an i layer, and a p layer and had a thickness of 1 μm or less, thereby completing a photovoltaic layer. Lastly, an ITO layer with a thickness of 70 nm was formed by a known sputtering method. The substrate was then cut into pieces to obtain the photovoltaic member 1101 (239 mm×356 mm). The photovoltaic member 1101 was subjected to processing described below in order to avoid short circuit of the photovoltaic layer around the edges of the substrate.

First, paste containing an etchant (FeCl$_3$) for the ITO layer was put on a surface of the photovoltaic member 1101 along the outer periphery of the substrate by screen printing.

The substrate was then washed with pure water to remove a part of the ITO layer and ensure electric separation between an upper electrode, which was formed from the ITO layer, the substrate, and a lower electrode, which was composed of tungsten, silver, or zinc oxide (FIG. 1A).

Second, the thin metal wires 1102 were prepared in a manner described below. Chosen as raw material was a copper wire which had a diameter of 4 to 5 mm and whose outer circumferential surface was covered with a silver foil having a thickness of 50 µm. The copper wire was shaped by a wiring roll into a core wire having a diameter of 100 µm. 500 g of the continuous core wire was wound around a bobbin. The thickness of a silver coat after the copper wire was shaped is about 1 µm. Next, a coat was formed around the core wire from resin that contained electroconductive filler by a roll coater device for enamel wire. The coat had a two-layer structure with a completely cured inner layer and an outer layer for fixing the thin metal wires 1102 onto the photovoltaic layer by bonding. The inner layer was formed as follows:

First, the core wire was wound off the bobbin and put through an inner layer forming treatment tank. The inner layer forming treatment tank is composed of a rotary roll and a piece of felt. The rotary roll winds up resin containing filler for the inner layer. The core wire put through the inner layer forming treatment tank comes into contact with the rotary roll first. At this point, the resin wound up by the rotary roll is applied to the core wire. The core wire then comes into contact with the felt piece, and excess resin is removed upon contact. Next, the core wire reaches a heating furnace, where the applied resin is completely cured. In order to ensure that the resin is applied evenly, the series of steps of application, removal, and curing was repeated several times. As the core wire to which the resin was applied was wound, the outer diameter of the core wire was measured and the measurement was fed back to adjust the viscosity of the resin. Based on the feedback, the viscosity of the resin was lowered to reduce the amount of resin wound up by the rotary roll and, as a result, the amount of resin applied as well. Xyelen, which is a solvent, was used to adjust the viscosity of the resin. The composition of the resin used is as follows:

Carbon black particles with a diameter of 30±20 nm were used as the filler, and were adjusted to have a volume density of 35%. The mixing ratio of the filler and the resin when the weight of a mixture to be obtained was set as 100 was: 6.4 parts by weight of butyral, 4.2 parts by weight of cresol resin, phenol resin, or aromatic hydrocarbon-based resin, 18 parts by weight of diol isocyanate as a curing agent, 18 parts by weight of xyelen as a solvent, 12 parts by weight of diethylene glycol monomethyl ether, 3.6 parts by weight of cyclohexane, and 0.7 parts by weight of γ-mercaptopropyltrimethoxysilane as a coupling agent. The components were mixed and dispersed in a paint shaker. The thus obtained inner layer of the coat was about 5 µm in thickness and about 0.5 Ωcm in resistance.

The outer layer was formed by a method described below. The core wire on which the inner layer has been formed by application was put through an outer layer forming treatment tank. The outer layer forming treatment tank is composed of a rotary roll and a dice. The rotary roll winds up resin containing filler for the outer layer. The core wire put through the outer layer forming treatment tank comes into contact with the rotary roll first. At this point, the resin wound up by the rotary roll is applied to the core wire. The core wire then passes through the dice to remove excess resin. Next, the core wire reaches a heating furnace, where a solvent of the applied resin is vaporized semi-curing the resin. In order to ensure that the resin is applied evenly, the series of steps of application, removal, and curing was repeated several times. The hole diameter of the dice was set to increase as the series of steps was repeated with the final thickness of the outer layer being 20 µm. The composition of the resin used is as follows:

Carbon black particles with a diameter of 30±20 nm were used as the filler. 35 parts by weight of carbon black, 41 parts by weight of urethane resin, 14 parts by weight of phenoxy resin, 6 parts by weight of diphenylmethane diisocyanate with hydrogen added to serve as a curing agent, 4 parts by weight of aromatic solvent as a solvent, and 0.7 parts by weight of γ-mercaptopropyltrimethoxysilane as a coupling agent were mixed and dispersed in a paint shaker. The thus obtained outer layer of the coat was about 0.5 Ωcm in resistance.

Secondly, the thus prepared wire was cut such that each of the thin metal wires 1102 had a length of 350 mm. Bowing and twisting were corrected to make the thin metal wires 1102 straight. To correct bowing and twisting, the thin metal wires 1102 were passed between two rotary rollers which were made of rubber and were in contact with each other.

Thirdly, the thin metal wires 1102 coated with electroconductive resin were arranged and fixed onto the photovoltaic member 1101 in a manner described below. Both ends of the prepared thin metal wires 1102 were fixed to the ends of the surface of the photovoltaic member 1101 through pieces of double-sided tape 1107. The double-sided tape 1107 used was obtained by applying acrylic adhesive resin to each side of a polyimide backing. The thin metal wires 1102 were fixed to the double-sided tape 1107 while a tensile force of 0.49 N was applied to the thin metal wires 1102.

Figure 10B:
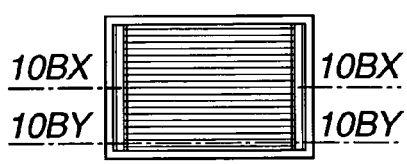
Figure 10B:
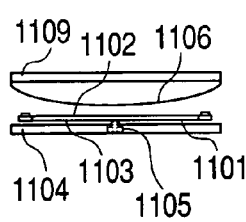
Figure 10B:
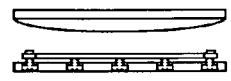

The thus obtained complex 1103 was inserted in the thermocompression bonding device to fix the thin metal wires 1102 onto the photovoltaic member 1101. FIGS. 10A to 10D show, in stages, the progress of the process started in FIG. 10A. FIG. 10BX is a sectional view taken along the line 10BX—10BX in FIG. 10B and shows the complex 1103, which has been put on the heat plate 1104 by an automatic hand with claws. It was easy to put the complex 1103 on the heat plate 1104 with the automatic hand since the movable support members 1105 were protruded 10 mm above the surface of the heat plate 1104. The elastic sheet 1106, a chamber 1109, and an airtight space between the elastic sheet 1106 and the chamber 1109 were placed above the heat plate 1104. The airtight space was connected through a flexible pipe (not shown in the drawing) to a pressurizing pump, which at this stage was already in operation to pressurize the airtight space at a pressure 10 kPa higher than the pressure of the outside. The chamber 1109 was a metal chamber. The elastic sheet 1106 was a PTFE sheet with a thickness of 50 µm. An O-ring was provided between the chamber 1109 and the elastic sheet 1106.

At the stage of FIG. 10B, the movable support members 1105 have not sunk yet, keeping the complex 1103 from coming into contact with the heat plate 1104. Therefore, the complex 1103 at this point was heated by radiation heat from the heat plate 1104, heat transmitted from the movable support members 1105, and heat transfer due to convection of the outside air. The temperature of the complex 1103 at this stage rose slowly and the temperature increased rate was about 5° C./s during a period immediately after the complex 1103 was put on the heat plate 1104.

Figure 10C:
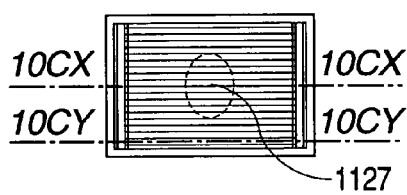
Figure 10C:
Figure 10C:

In FIG. 10C, the chamber 1109 was being lowered by a fixed distance. While the chamber 1109 was lowered, the interior of each of the movable support members 1105 was deaerated through a pipe (not shown) to apply atmospheric pressure to the movable support members 1105. The springs in the movable support members 1105 were compressed by the application of atmospheric pressure, thereby causing the movable support members 1105 to sink completely in the heat plate 1104 before the elastic sheet 1106 came into contact with the complex 1103. This brought the complex 1103 into contact with the heat plate 1104, and heat was transmitted to the complex 1103 directly from the heat plate 1104. The temperature rise rate of the complex was 36° C./s as measured immediately after the complex 1103 came into contact with the heat plate 1104.

Figure 10D:
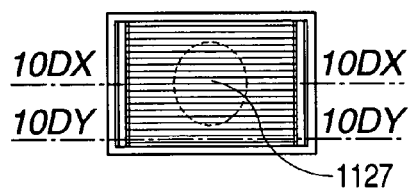
Figure 10D:
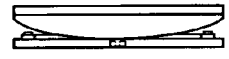
Figure 10D:
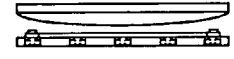
Figure 10E:
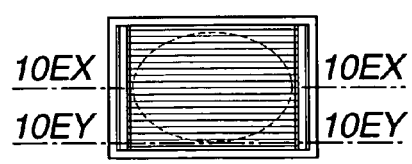
Figure 10E:
Figure 10E:
Figure 10F:
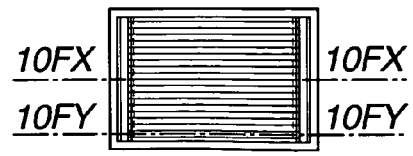
Figure 10F:
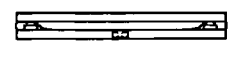
Figure 10F:
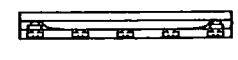

Over the stages shown in FIGS. 10D to 10F, an increasingly larger portion of the thin metal wires 1102 stretching from the central portion toward the edges of the thin metal wires 1102 was pressed against and fixed to the photovoltaic member 1101. At this point, the thin metal wires 1102 were pressed toward both ends against the photovoltaic member 1101. Therefore, the thin metal wires 1102 were fixed onto the photovoltaic member 1101 while maintaining their straightness. It took about 0.5 seconds to move from the stage in FIG. 10D to FIG. 10F.

A vacuum pump 88 was used to exhaust the interiors of the complex suction holes and the deaeration groove. However, the exhaust amount was much smaller than in a conventional method since there was almost no space between the elastic sheet 1106, the complex 1103, and the heat plate 1104. At the stage of FIG. 10F, the thin metal wires 1102 were pressed against the photovoltaic member 1101 along their entire lengths and fixed.

The complex 1103 and the heat plate 1104 were kept in contact with each other for 60 seconds. During this period, carbon paste was cured and the thin metal wires 1102 were fixed onto the photovoltaic member 1101 through the carbon paste.

The chamber 1109 was then lifted to return to the state of FIG. 10B. At the same time, deaeration of the interiors of the movable support members 1105 was stopped. As a result, the springs in the movable support members 1105 was stretched, thereby once again distancing the complex 1103 and the heat plate 1104 from each other by 10 mm and ending heating of the complex 1103. Since the complex 1103 and the heat plate 1104 were automatically distanced from each other by 10 mm again, the complex 1103 was easily moved away from the heat plate 1104.

Thereafter, a known bus bar electrode was formed on the complex to complete a photovoltaic device. When thin metal wires were bonded by thermocompression onto the photovoltaic member several times by the method used above, the probability of the thin metal wires undergoing bending to an extent greater than a certain degree was found to be extremely low.

EXAMPLE 6

Figure 11A:
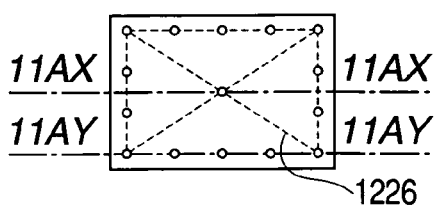
FIGS. 11A, 11B, 11C, 11D, 11E, 11F, 11AX, 11BX, 11CX, 11DX, 11EX, 11FX, 11AY, 11BY, 11CY, 11DY, 11EY and 11FY are diagrams illustrating an example of the second aspect of the present invention, FIG. 11AX being a sectional view taken along the line 11AX—11AX in FIG. 11A, FIG. 11AY being a sectional view taken along the line 11AY—11AY in FIG. 11A, FIG. 11BX being a sectional view taken along the line 11BX—11BX in FIG. 11B, FIG. 11BY being a sectional view taken along the line 11BY—11BY in FIG. 11B, FIG. 11CX being a sectional view taken along the line 11CX—11CX in FIG. 11C, FIG. 11CY being a sectional view taken along the line 11CY—11CY in FIG. 1C, FIG. 11DX being a sectional view taken along the line 11DX—11DX in FIG. 1D, FIG. 11DY being a sectional view taken along the line 11DY—11DY in FIG. 1D, FIG. 11EX being a sectional view taken along the line 11EX—11EX in FIG. 1E, FIG. 11EY being a sectional view taken along the line 11EY—11EY in FIG. 11E, FIG. 11FX being a sectional view taken along the line 11FX—11FX in FIG. 11F, FIG. 11FY being a sectional view taken along the line 11FY—11FY in FIG. 11F.
Figure 11B:
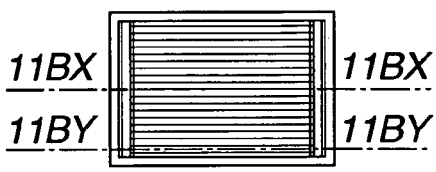
Figure 11C:
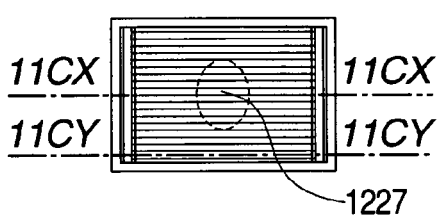
Figure 11D:
Figure 11E:
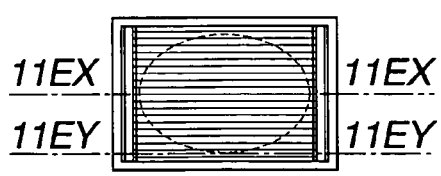
Figure 11F:
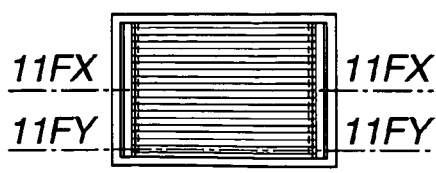
Figure 11A:
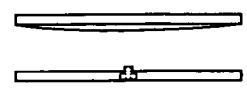
Figure 11A:
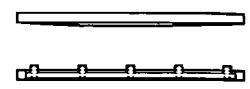
Figure 11B:
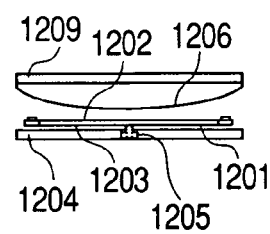
Figure 11B:
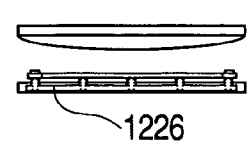
Figure 11C:
Figure 11C:
Figure 11D:
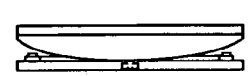
Figure 11D:
Figure 11E:
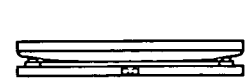
Figure 11E:
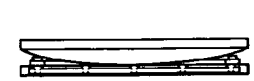
Figure 11F:
Figure 11F:
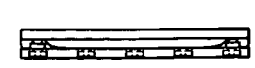

This example is shown in FIGS. 11A to 11F, FIGS. 11AX to 11FX, and FIGS. 11AY to 11FY. FIGS. 11A to 11F are diagrams showing the process of this example step-by-step. A complex 1203 serving as a thermocompression bonding device was identical with the one in Example 1. Movable support members 1205 were linked to one another through a linking member 1226, so that all the movable support members sank in a heat plate 1204 in conjunction with one another. In FIGS. 11A to 11F, an elastic sheet 1206 is in contact with the complex 1206 in an area 1227. The contact area 1227 was increased as the process proceeds as shown in the drawings. In FIG. 1C, the elastic sheet 1206 comes into contact with the movable support members 1205 that are located at the center. As the movable support members 1205 at the center were depressed by the elastic sheet 1206 in subsequent stages, the rest of the movable support members 1205 sank in conjunction with the movable support members 1205 at the center. This allowed the complex to keep a flat state and provided an effect of preventing thin metal wires 1202 from bending. Similar to Example 1, thin metal wires were bonded by thermocompression onto the photovoltaic member several times in order to obtain the probability of the thin metal wires undergoing bending to an extent greater than a certain degree. The probability thus obtained was found to be extremely low. This example did not require a device for deaerating the support members which is necessary in Example 1. Therefore, this example is advantageous in that the device cost can be kept low.

EXAMPLE 7

Figure 13A:
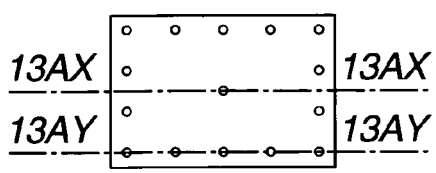
FIGS. 13A, 13B, 13C, 13D, 13E, 13F, 13AX, 13BX, 13CX, 13DX, 13EX, 13FX, 13AY, 13BY, 13CY, 13DY, 13EY and 13FY are diagrams illustrating an example of the second aspect of the present invention, FIG. 13AX being a sectional view taken along the line 13AX—13AX in FIG. 13A, FIG. 13AY being a sectional view taken along the line 13AY—13AY in FIG. 13A, FIG. 13BX being a sectional view taken along the line 13BX—13BX in FIG. 13B, FIG. 13BY being a sectional view taken along the line 13BY—13BY in FIG. 13B, FIG. 13CX being a sectional view taken along the line 13CX—13CX in FIG. 13C, FIG. 13CY being a sectional view taken along the line 13CY—13CY in FIG. 13C, FIG. 13DX being a sectional view taken along the line 13DX—13DX in FIG. 13D, FIG. 13DY being a sectional view taken along the line 13DY—13DY in FIG. 13D, FIG. 13EX being a sectional view taken along the line 13EX—13EX in FIG. 13E, FIG. 13EY being a sectional view taken along the line 13EY—13EY in FIG. 13E, FIG. 13FX being a sectional view taken along the line 13FX—13FX in FIG. 13F, FIG. 13FY being a sectional view taken along the line 13FY—13FY in FIG. 13F.
Figure 13A:
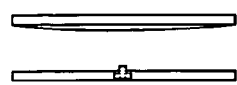
Figure 13A:
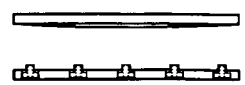
Figure 13B:
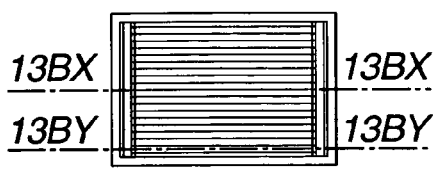
Figure 13B:
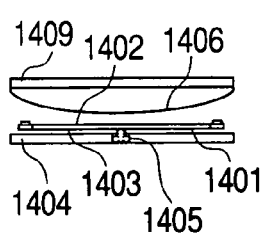
Figure 13B:
Figure 13C:
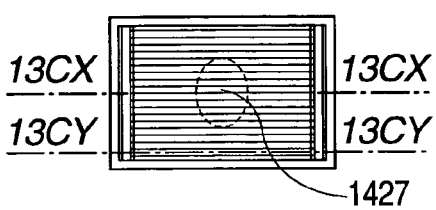
Figure 13C:
Figure 13C:
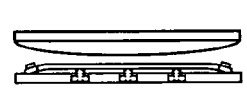
Figure 13D:
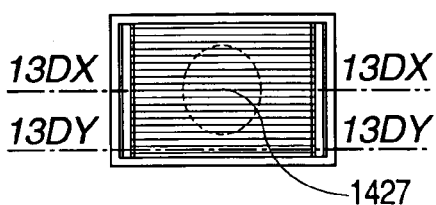
Figure 13D:
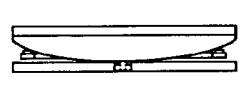
Figure 13D:
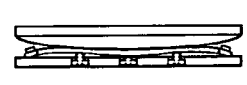
Figure 13E:
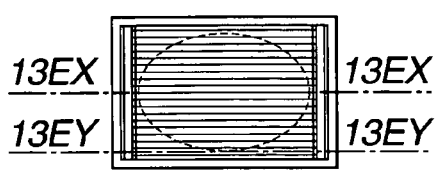
Figure 13E:
Figure 13E:
Figure 13F:
Figure 13F:
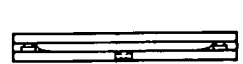
Figure 13F:
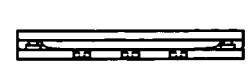

This example is shown in FIGS. 13A to 13F, FIGS. 13AX to 13FX, and FIGS. 13AY to 13FY. A complex 1403 of this example was identical with the one in Example 1. Movable support members 1405 of this example were arranged to support the edges of the complex 1403 in the direction along thin metal wires 1402 except the four corners of the complex 1403. This pulled the ends of a photovoltaic member 1401 down as shown in FIG. 13DY, which is a sectional view taken along the line 13DY—13DY in FIG. 13D, making it possible to control deformation of the complex when an elastic sheet 1206 came into contact with the central portion of the complex 1203. Therefore, a tensile force applied to the thin metal wires 1402 were prevented from being eased.

Similar to Example 1, thin metal wires were bonded by thermocompression onto the photovoltaic member several times in order to obtain the probability of the thin metal wires undergoing bending to an extent greater than a certain degree. The probability thus obtained was found to be extremely low. This example did not require a member for linking movable support members to one another which is necessary in Example 2. Therefore, this example is advantageous in that the device cost can be kept low.

Comparative Example 2

Figure 16C:
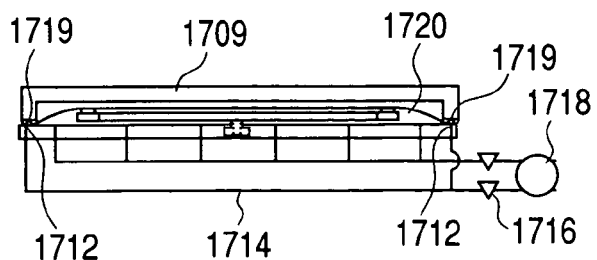
Figure 16C:
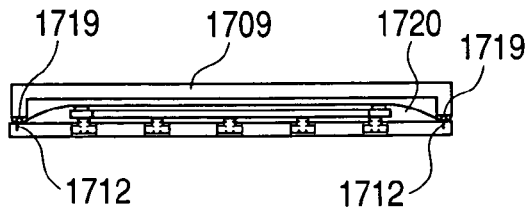
Figure 16D:
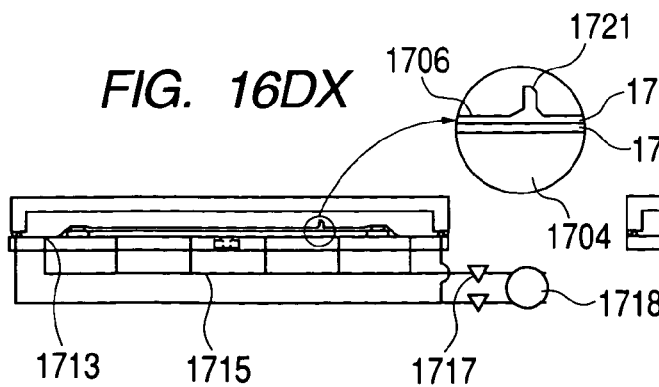
Figure 16D:
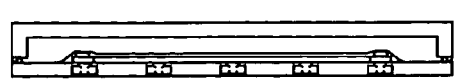

This example used a complex identical to the one in Example 1. A thermocompression bonding device of this example was the conventional thermocompression bonding device disclosed in Japanese Patent Application Laid-Open No. 2003-039554 and shown in FIGS. 16AX to 16DX and FIGS. 16AY to 16DY. When the interior of an airtight space 1720 was deaerated through a deaeration groove 1713 over the state shown in FIGS. 16CX to 16DX and FIGS. 16CY to 16DY, there has been a considerable change in pressure and thin metal wires 1702 were often fixed in a bent state onto a photovoltaic member 1701.

What is claimed is:

1. A method of manufacturing a photovoltaic device, comprising:
   a first step of fixing thin metal wires which are coated with electroconductive resin, to a principal surface of a photovoltaic member;
   a second step of heating the photovoltaic member to which the thin metal wires are fixed; and
   a third step of pressing an elastic film against the photovoltaic member and the thin metal wires while a pressure of first gas on a side opposite the photovoltaic member across the elastic film is larger than a pressure of second gas present in a space between the elastic film and the principal surface of the photovoltaic member.

2. The method of manufacturing a photovoltaic device according to claim 1, wherein the first step further comprises:
- a first sub-step of elastically deforming an intermediate region of the photovoltaic member to make the intermediate region convex in a direction opposite to a normal line direction of the principal surface of the photovoltaic member while maintaining shapes of a first region and a second region of the photovoltaic member, the intermediate region being located between the first region and the second region;
- a second sub-step of fixing a first portion of the thin metal wires to the first region and fixing a second portion of the thin metal wires to the second region; and
- a third sub-step of undoing the elastic deformation to apply a tensile force to an intermediate portion between the first portion and the second portion of the thin metal wires.

3. The method of manufacturing a photovoltaic device according to claim 1,
wherein a step of shaping the photovoltaic member along an outer wall of a column is put before the first step, and
wherein the thin metal wires are fixed in the first step to make a longitudinal direction of the thin metal wires parallel to an axis of the column.

4. A method of manufacturing a photovoltaic device, comprising:
- a first step of placing a complex which is obtained by fixing thin metal wires at both ends onto a photovoltaic member, on movable support members protruding from a principal surface of a heat plate; and
- a second step of pressing an elastic sheet against the complex while a pressure applied to a surface of the elastic sheet that is opposite the heat plate is larger than a pressure applied to a surface of the elastic sheet that faces the heat plate, wherein the movable support members sink in the heat plate before the elastic sheet comes into contact with the complex.

5. A method of manufacturing a photovoltaic device, comprising:
- a first step of placing a complex which is obtained by fixing thin metal wires at both ends onto a photovoltaic member, on movable support members protruding from a principal surface of a heat plate; and
- a second step of pressing an elastic sheet against the complex while a pressure applied to a surface of the elastic sheet that is opposite the heat plate is larger than a pressure applied to a surface of the elastic sheet that faces the heat plate, wherein the movable support members simultaneously sink in the heat plate in conjunction with one another.

6. A method of manufacturing a photovoltaic device, comprising:
- a first step of placing a complex which is obtained by fixing thin metal wires at both ends onto a photovoltaic member, on movable support members protruding from a principal surface of a heat plate; and
- a second step of pressing an elastic sheet against the complex while a pressure applied to a surface of the elastic sheet that is opposite the heat plate is larger than a pressure applied to a surface of the elastic sheet that faces the heat plate, wherein the complex is held in a manner that places edges of the complex on a lower plane than a central portion of the complex before the elastic sheet is pressed against the complex.

7. The method of manufacturing a photovoltaic device according to claim 6, wherein the movable support members have different levels of supporting power.

* * * * *